US009120975B2

(12) United States Patent
Gu et al.

(10) Patent No.: US 9,120,975 B2
(45) Date of Patent: *Sep. 1, 2015

(54) YELLOW-GREEN TO YELLOW-EMITTING PHOSPHORS BASED ON TERBIUM-CONTAINING ALUMINATES

(71) Applicant: Intematix Corporation, Fremont, CA (US)

(72) Inventors: Jingtao Gu, Shanghai (CN); Chengjun Duan, Changshu (CN); Yi-Qun Li, Danville, CA (US)

(73) Assignee: Intematix Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/513,133

(22) Filed: Oct. 13, 2014

(65) Prior Publication Data
US 2015/0061489 A1    Mar. 5, 2015

Related U.S. Application Data

(63) Continuation of application No. PCT/CN2012/087751, filed on Dec. 28, 2012, and a continuation-in-part of application No. 13/931,214, filed on Jun. 28, 2013, now Pat. No. 8,877,094, which (Continued)

(51) Int. Cl.
*C09K 11/77* (2006.01)
*F21V 9/16* (2006.01)
(Continued)

(52) U.S. Cl.
CPC ......... *C09K 11/7774* (2013.01); *C09K 11/0883* (2013.01); *C09K 11/7734* (2013.01); *F21V 9/16* (2013.01); *H01L 33/502* (2013.01); *H05B 33/02* (2013.01)

(58) Field of Classification Search
None
See application file for complete search history.

(56) References Cited

U.S. PATENT DOCUMENTS 5,037,577 A    8/1991  Yamanoi et al.
5,600,202 A    2/1997  Yamada et al.
(Continued)

FOREIGN PATENT DOCUMENTS

CN    1254747    5/2000
CN    1629251    6/2005
(Continued)

OTHER PUBLICATIONS

International Search Report and Written Opinion for PCT/CN2012/087751 Issued Oct. 3, 2013.

(Continued)

*Primary Examiner* — Melvin C Mayes
*Assistant Examiner* — Stefanie Cohen
(74) *Attorney, Agent, or Firm* — David H. Jaffer; Pillsbury Winthrop Shaw Pittman LLP

(57) ABSTRACT

Yellow-green to yellow-emitting, lutetium aluminate-based terbium (Tb) containing phosphors for use in white LEDs, general lighting, and LED and backlighting displays are disclosed herein. The phosphor may further contain gadolinium (Gd). In one embodiment of the present invention, the phosphor comprises a cerium-activated, yellow-green to yellow-emitting lutetium aluminate-based phosphor having the formula $(Lu_{1-x}A_x)_3Al_5O_{12}$:Ce wherein A is at least one of Gd and Tb and $0.1 \le x \le 1.0$, wherein the phosphor is configured to emit light having a peak emission wavelength ranging from about 550 nm to about 565 nm, and wherein the phosphor contains at least some Tb.

25 Claims, 15 Drawing Sheets

Related U.S. Application Data is a continuation of application No. 13/415,623, filed on Mar. 8, 2012, now Pat. No. 8,475,683.

(60) Provisional application No. 61/450,310, filed on Mar. 8, 2011.

(51) Int. Cl.
| | |
|---|---|
| *H05B 33/02* | (2006.01) |
| *C09K 11/08* | (2006.01) |
| *H01L 33/50* | (2010.01) |

(56) References Cited

U.S. PATENT DOCUMENTS

| | | | |
|---|---|---|---|
| 5,998,925 | A | 12/1999 | Shimizu et al. |
| 6,013,199 | A | 1/2000 | McFarland et al. |
| 6,069,440 | A | 5/2000 | Shimizu et al. |
| 6,245,259 | B1 | 6/2001 | Hohn et al. |
| 6,409,938 | B1 | 6/2002 | Comanzo |
| 6,577,073 | B2 | 6/2003 | Shimizu et al. |
| 6,669,866 | B1 | 12/2003 | Kummer et al. |
| 6,869,544 | B2 | 3/2005 | Chen et al. |
| 7,029,602 | B2 | 4/2006 | Oshio |
| 7,267,786 | B2 | 9/2007 | Fiedler et al. |
| 7,311,858 | B2 | 12/2007 | Wang et al. |
| 7,521,862 | B2 | 4/2009 | Mueller et al. |
| 7,573,072 | B2 | 8/2009 | Setlur et al. |
| 7,575,697 | B2 | 8/2009 | Li et al. |
| 7,753,553 | B2 | 7/2010 | Justel et al. |
| 8,274,215 | B2 | 9/2012 | Liu et al. |
| 8,529,791 | B2 | 9/2013 | Wu et al. |
| 2003/0001495 | A1 | 1/2003 | Liu et al. |
| 2003/0203205 | A1 | 10/2003 | Bi et al. |
| 2004/0000862 | A1 | 1/2004 | Setlur et al. |
| 2004/0084655 | A1 | 5/2004 | Vartuli et al. |
| 2004/0173807 | A1 | 9/2004 | Tian et al. |
| 2004/0256974 | A1 | 12/2004 | Mueller-Mach et al. |
| 2005/0092408 | A1 | 5/2005 | Lauf et al. |
| 2005/0093442 | A1 | 5/2005 | Setlur et al. |
| 2005/0141240 | A1 | 6/2005 | Hata et al. |
| 2005/0142240 | A1 | 6/2005 | Chiu et al. |
| 2005/0145868 | A1 | 7/2005 | Kummer et al. |
| 2005/0199897 | A1 | 9/2005 | Setlur et al. |
| 2005/0242329 | A1 | 11/2005 | Fiedler et al. |
| 2006/0028122 | A1 | 2/2006 | Wang et al. |
| 2006/0083694 | A1 | 4/2006 | Kodas et al. |
| 2006/0158097 | A1 | 7/2006 | Juestel et al. |
| 2006/0164005 | A1 | 7/2006 | Sun |
| 2008/0018235 | A1 | 1/2008 | Wang et al. |
| 2008/0064586 | A1 | 3/2008 | Mitomo et al. |
| 2008/0116788 | A1 | 5/2008 | Yamazaki et al. |
| 2008/0138268 | A1 | 6/2008 | Tao et al. |
| 2008/0203892 | A1 | 8/2008 | Schmidt et al. |
| 2008/0231171 | A1 | 9/2008 | Schmidt et al. |
| 2008/0296596 | A1 | 12/2008 | Setlur et al. |
| 2009/0008663 | A1 | 1/2009 | Shimizu et al. |
| 2009/0066221 | A1 | 3/2009 | Schmidt et al. |
| 2009/0072255 | A1 | 3/2009 | Takahashi et al. |
| 2009/0072710 | A1 | 3/2009 | Schmidt et al. |
| 2009/0174310 | A1 | 7/2009 | Vogt et al. |
| 2009/0212314 | A1 | 8/2009 | Im et al. |
| 2009/0218585 | A1 | 9/2009 | Zhuang et al. |
| 2009/0243467 | A1 | 10/2009 | Shimizu et al. |
| 2010/0059681 | A1 | 3/2010 | Nakamura et al. |
| 2010/0085728 | A1 | 4/2010 | Seto et al. |
| 2010/0225226 | A1 | 9/2010 | Murazaki et al. |
| 2010/0308712 | A1 | 12/2010 | Liu et al. |
| 2011/0050086 | A1 | 3/2011 | Liu et al. |
| 2011/0175028 | A1 | 7/2011 | Shimamura et al. |
| 2011/0279022 | A1 | 11/2011 | Winkler et al. |
| 2011/0305005 | A1 | 12/2011 | Tsukatani et al. |
| 2012/0112130 | A1 | 5/2012 | Wu et al. |
| 2013/0001444 | A1 | 1/2013 | Zhou et al. |

FOREIGN PATENT DOCUMENTS

| | | |
|---|---|---|
| CN | 101137738 A | 3/2008 |
| CN | 101182416 A | 5/2008 |
| CN | 101638578 | 2/2010 |
| CN | 101760196 A | 6/2010 |
| CN | 102687266 | 9/2012 |
| CN | 102723422 | 10/2012 |
| DE | 19934126 | 1/2001 |
| DE | 10 2008 051029 A1 | 4/2010 |
| EP | 1378556 | 1/2004 |
| EP | 1589090 | 10/2005 |
| JP | H0673376 A | 3/1994 |
| JP | H10242513 A | 9/1998 |
| JP | 1478855 A | 3/2004 |
| JP | 2004-115633 A | 4/2004 |
| JP | 2005008844 A | 1/2005 |
| JP | 2006-041096 A | 2/2006 |
| JP | 2006-265542 A | 10/2006 |
| JP | 2006-299168 A | 11/2006 |
| JP | 2008-189811 A | 8/2008 |
| JP | 2008291203 A | 12/2008 |
| JP | WO2010053197 A1 | 5/2010 |
| JP | 2010-121068 A | 6/2010 |
| KR | 1002007-0106536 A | 11/2007 |
| TW | 2006193586 A | 6/2006 |
| WO | WO 2004/084261 | 9/2004 |
| WO | WO 2005/061659 A1 | 7/2005 |
| WO | WO2005123876 A | 12/2005 |
| WO | WO 2006/129559 | 12/2006 |
| WO | WO2008056292 A1 | 5/2008 |
| WO | WO 2010/074963 A1 | 7/2010 |

OTHER PUBLICATIONS

Kuru, et al., "Yttrium Aluminum Garnet as a Scavenger for Ca and Si," J. American Ceramic Soc., 2008, vol. 91, No. 11, pp. 3663-3667.

Li, K., et al., "Relationship between Crystal Structure and Luminescence Properties of $(Y_{0.96-x\ /\ Lnx}\ Ce_{0.04})_3\ Al_5\ O_{12}$ (Ln=Gd, La, Lu) Phosphors," Journal of Rare Earths vol. 25, 2007, pp. 692-696.

Kim, et al., "Synthesis and Luminescent Characterization of Zinc Thiogallant," J. of Europ. Ceramic Soc., Mar. 26, 2007, vol. 27, pp. 3667-3670.

Li, et al., "Fabrication of Transparent Cerium-doped Lutetium Aluminum Garnet Ceramics by co-Precipitation Routes," J. American Ceramic Soc., 2006, vol. 89, No. 67, pp. 2356-2358.

Baccaro, et al., "Influence of Si-codoping on YAG:Ce Scintillation Characteristics," IEEE Trans. On Nuclear Science, Aug. 2005, pp. 1105-1108, vol. 52, No. 4.

Fernandez, et al., "Highly Porous Yttrium Aluminum Garnet (YAG) Particles Synthesized by a Gel Supported Precipitation (GSP) Process," J. of Mat. Sci., Jan. 2003, pp. 2331-2335, vol. 38.

Wu, et al., "Spectral Properties of Various Cerium Doped Garnet Phosphors for Application in White GAN-based LEDs," Mats. Research Soc. Symp. Proc., Jan. 1, 2001, vol. 658, pp. GG11.8.1-GG.11.8.6.

Kang, et al., "YAG:Ce Phosphor Particles prepared by Ultrasonic Spray Pyrolysis," Mats. Research Bull., 2000, pp. 789-798.

2 wt% MgF$_2$        3 wt% MgF$_2$ 4 wt% MgF$_2$        5 wt% MgF$_2$

SEM Morphology of Lu$_{2.91}$Ce$_{0.09}$Al$_5$O$_{12}$ with different MgF$_2$ additive concentrations

YELLOW-GREEN TO YELLOW-EMITTING PHOSPHORS BASED ON TERBIUM-CONTAINING ALUMINATES

CROSS-REFERENCE TO RELATED APPLICATIONS

This application is a continuation of PCT Application No. PCT/CN2012/087751 with an international filing date of Dec. 28, 2012 entitled YELLOW-GREEN TO YELLOW-EMITTING PHOSPHORS BASED ON TERBIUM-CONTAINING ALUMINATES by Jingtao Gu et al., (now published as WO 2014/101073 A1), and is also a continuation-in-part of U.S. patent application Ser. No. 13/931,214 filed Jun. 28, 2013, entitled YELLOW-GREEN TO YELLOW-EMITTING PHOSPHORS BASED ON HALOGENATED-ALUMINATES, by Yi-Qun Li et al., now U.S. Pat. No. 8,877,094, which is a continuation of U.S. patent application Ser. No. 13/415,623 filed Mar. 8, 2012, now U.S. Pat. No. 8,475,683, entitled YELLOW-GREEN TO YELLOW-EMITTING PHOSPHORS BASED ON HALOGENATED-ALUMINATES, by Yi-Qun Li et al., which claims the benefit of U.S. Provisional Application No. 61/450,310, filed Mar. 8, 2011, entitled PHOSPHOR COMPOSITION, by Yi-Qun Li et al., which applications are incorporated herein by reference in their entirety.

BACKGROUND OF THE INVENTION

1. Field of the Invention

Embodiments of the present disclosure are directed in to yellow-green to yellow-emitting phosphors based on aluminates that contain the rare earth terbium (Tb). Such phosphors are applicable to a number of different technologic areas, including general lighting systems, white light illumination systems based on white LEDs, signal lights, indicator lights, etc., as well as display applications such as display backlighting, plasma display panels, LED-based display panels, and the like.

2. Description of the Related Art

Embodiments of the present invention are directed to aluminate-based phosphors that, when activated by cerium, and when doped with the rare earth terbium (Tb) emit visible light in the yellow-green to yellow portion of the electromagnetic spectrum. The phosphor may also include the rare earths lutetium (Lu) and/or gadolinium (Gd). The phrase "visible light in the yellow-green to yellow portion of the electromagnetic spectrum" is defined to mean light having a peak emission wavelength of about 550 nm to about 600 nm. Such phosphors may be used in commercial markets where white light is generated using so-called "white light LEDs," noting as an aside that this term is somewhat of a misnomer, since light emitting diodes emit light of a specific monochromatic color and not a combination of wavelengths perceived as white by the human eye. The term is nonetheless entrenched in the lexicon of the lighting industry.

Historically, YAG:Ce (yttrium aluminate garnet activated with cerium) has been used to supply the yellow component of the light in the lighting systems mentioned above. In comparison to other phosphor hosts, particularly those based on the silicates, sulphates, nitridosilicates, and oxo-nitridosilicates, YAG:Ce has a relatively high absorption efficiency when excited by blue light, is stable in high temperature and humidity environments, and has a high quantum efficiency (QE>95%), all the while displaying a broad emission spectrum.

One disadvantage to using a YAG:Ce based phosphor, other than inadequate color rendering in some situations, is that the peak emission of this phosphor is too long, that is to say, too deep towards the orange or red for use as a luminescent source in, for example, a backlighting application. An alternative to YAG:Ce is the cerium doped $Lu_3Al_5O_{12}$ compound (LAG:Ce), which has the same crystalline structure as YAG:Ce, a similar temperature and humidity stability as the yttrium-based compound, and likewise quantum efficiency. Despite these similarities, LAG:Ce exhibits a different peak emission wavelength than its YAG counterpart; in the lutetium case, this peak wavelength is at about 540 nm. This emission wavelength is still not short enough, however, to be ideal for certain applications such as backlighting applications, and general lighting applications, where appropriate.

Thus, what is needed in the art, particularly in fields related to backlighting technologies and general lighting, is a phosphor with a structure comparable to a garnet in terms of temperature and humidity stability, but having at the same time a peak emission wavelength ranging from about 550 nm to about 600 nm. According to the present embodiments, these challenges may be addressed by providing lutetium (Lu) aluminate-based phosphors that include the rare earth terbium (Tb). The phosphors may also include the rare earth gadolinium (Gd).

SUMMARY OF THE INVENTION

Embodiments of the present disclosure are directed to yellow-green and yellow-emitting, lutetium aluminate-based phosphors containing terbium (Tb) and in some embodiments gadolinium (Gd) in addition to Tb. These phosphors may be used in white LEDs, in general lighting applications, and in LED and backlighting displays.

In one embodiment of the present invention, the phosphor may comprise a cerium-activated, yellow-green to yellow-emitting lutetium aluminate-based phosphor comprising terbium (Tb), aluminum (Al), and oxygen (O), wherein the phosphor is configured to absorb excitation radiation having a wavelength ranging from about 380 nm to about 480 nm, and to emit light having a peak emission wavelength ranging from about 550 nm to about 600 nm. The yellow-green to yellow-emitting aluminate-based phosphor may be excited by radiation having a wavelength ranging from about 420 nm to about 480 nm. The phosphor may have the formula $(Lu_{1-x}Tb_x)_3Al_5O_{12}$:Ce, wherein x ranges from about 0.1 to less than 1.0, and wherein the phosphor is configured to absorb excitation radiation having a wavelength ranging from about 380 nm to about 480 nm, and to emit light having a peak emission wavelength ranging from about 550 nm to about 565 nm. The phosphor may further include the rare earth element gadolinium (Gd) and have the formula $(Lu_{1-x-y}Tb_xGd_y)_3Al_5O_{12}$:Ce, wherein x ranges from about 0.1 to less than 1.0, y is greater than zero, and x+y<1. Furthermore, the Tb-containing phosphors may have a shift in CIE coordinates of less than 0.005 for both x and y coordinates over a temperature range from 20° C. to 220° C.—specific examples of such phosphors include $(Lu_{0.67}Tb_{0.3}Ce_{0.03})_3Al_5O_{12}$, $(Lu_{0.47}Tb_{0.5}Ce_{0.03})_3Al_5O_{12}$ and $(Lu_{0.47}Gd_{0.2}Tb_{0.3}Ce_{0.03})_3Al_5O_{12}$.

In another embodiment of the present invention, the phosphor comprises a cerium-activated, yellow-green to yellow-emitting aluminate-based phosphor having the formula $(Lu_{1-x-y}A_xCe_y)_3B_zAl_5O_{12}C_{2z}$; wherein A is Tb; B is at least one of Mg, Sr, Ca, and Ba; C is at least one of F, Cl, Br, and I; $0.001 \le x \le 1.0$; $0.001 \le y \le 0.2$; and $0 \le z \le 0.5$.

In another embodiment of the present invention, the phosphor comprises a cerium-activated, yellow-green to yellow-emitting aluminate-based phosphor represented by the formula $(Lu_{0.97-x}A_xCe_{0.03})_3Al_5O_{12}$. Here, A is Tb, and may further include Gd; and x ranges from about 0.001 to about 1.0.

According to further embodiments of the present invention, a white light illumination system may comprise: an excitation source with emission wavelength within a range of 200 nm to 480 nm; at least one of a red-emitting phosphor or a green-emitting phosphor; and a cerium-activated, yellow-green to yellow-emitting lutetium aluminate-based phosphor comprising terbium, wherein the phosphor is configured to emit light having a peak emission wavelength ranging from about 550 nm to about 565 nm. The cerium-activated, yellow-green to yellow-emitting lutetium aluminate-based phosphor may be configured to absorb excitation radiation having a wavelength ranging from about 380 nm to about 480 nm. The cerium-activated, yellow-green to yellow-emitting lutetium aluminate-based phosphor may further comprise gadolinium.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION OF THE INVENTION

Figure 1:
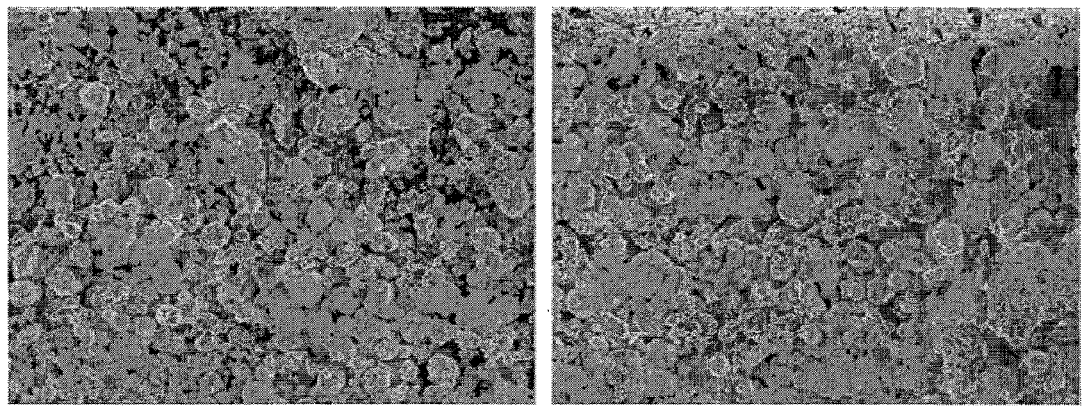
FIG. 1 shows the SEM morphology of $Lu_{2.91}Ce_{0.09}Al_5O_{12}$ with different $MgF_2$ additive concentrations, illustrating that particle sizes become larger and more homogeneous as the amount of the $MgF_2$ additive is increased.
Figure 1:
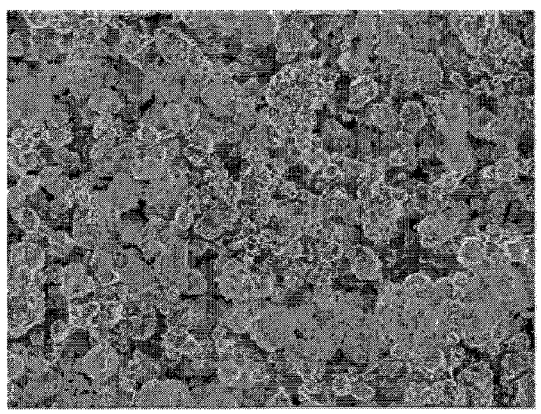
Figure 1:
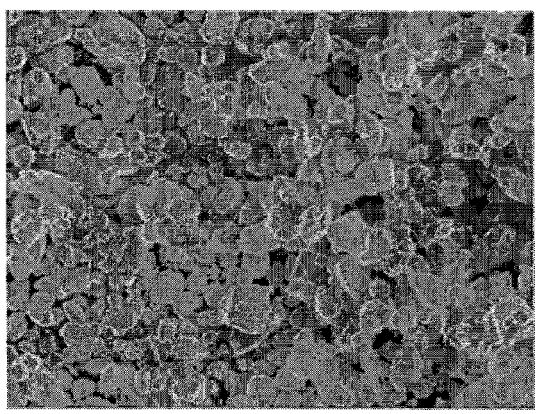

Embodiments of the present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

A yttrium aluminum garnet compound activated with the rare earth cerium (YAG:Ce) has been, historically, one of the most common choices of phosphor material made if the desired application was either high power LED lighting, or cool white lighting of a non-specific, general nature. As one might expect, there is a requirement in general lighting for highly efficient components, both in the case of the LED chip supplying the blue light component of the resultant white light, and the excitation radiation for the phosphor, where the phosphor typically supplies the yellow/green constituent of the resulting product white light.

As discussed in the previous section of this disclosure, YAG:Ce demonstrates this desired high efficiency, having a quantum efficiency greater than about 95 percent, and it would therefore appear to be a difficult task to improve upon this number. But it is known in the art that the efficiency of an LED chip increases with a decrease in emission wavelength, and thus it would appear, in theory anyway, that the efficiency of a general lighting system will be enhanced if a phosphor paired with an LED chip emitting at shorter wavelengths may be excited by those shorter wavelengths. The problem with this strategy, unfortunately, is that the emission efficiency of a YAG:Ce phosphor decreases when the wavelength of its blue excitation radiation is reduced to a level below about 460 nm.

The repercussions of this are, of course, that YAG:Ce should really only be paired with an LED chip having an emission wavelength no less than about 450 to 460 nm. But it is also known in the art that photon energies of the phosphor's excitation radiation depend strongly on the structure of the anionic polyhedron (comprising oxygen atoms in this case) surrounding the activator cation (cerium). It follows that the efficiency of the system may be enhanced if the excitation range of a garnet-based phosphor might be extended towards shorter wavelengths relative to a YAG:Ce phosphor. Thus, one of the objects of the present invention include altering the structure and nature of this anionic polyhedron to shift the excitation range the phosphor "desires" to see to shorter wavelengths relative to that of the traditional YAG:Ce, while maintaining in the meantime (or even improving) the enhanced properties that many garnets display.

The present disclosure will be divided into the following sections: first, a chemical description (using stoichiometric formulas) of the present halogenated aluminates will be given, followed by a brief description of viable synthetic methods that may be used to produce them. The structure of the present halogenated aluminates will be discussed next, along with its relationship to experimental data comprising wavelength and photoluminescent changes upon the inclusion of certain halogen dopants. Finally, the role these yellow-green and yellow-emitting phosphors may play in white light illumination, general lighting, and backlighting applications will be presented with exemplary data.

Chemical Description of the Present Halogenated Aluminate-Based Phosphors

The yellow to green-emitting, aluminate-based phosphors of the present invention contain both alkaline earth and halogen constituents. These dopants are used to achieve the desired photoemission intensity and spectral properties, but the fact that simultaneous alkaline earth and halogen substitutions provide a sort of self-contained charge balance is fortuitous as well. Additionally, there may be other advantageous compensations having to do with the overall changes to the size of the unit cell: while substitutions of any of Se, La, Gd, and/or Tb for Lu (either individually, or in combinations) may tend to expand or contract the size of the cell, the opposite effect may occur with substitutions of halogen for oxygen.

There are several ways to describe the formula of the present phosphors. In one embodiment, a green emitting, cerium-doped, aluminate-based phosphor may be described by the formula $(Lu_{1-a-b-c}Y_aTb_bA_c)_3(Al_{1-d}B_d)_5(O_{1-e}C_e)_{12}$:Ce, Eu, where A is selected from the group consisting of Mg, Sr, Ca, and Ba; B is selected from the group consisting of Ga and In; C is selected from the group consisting of F, Cl, and Br; $0 \leq a \leq 1$; $0 \leq b \leq 1$; $0 \leq e \leq 0.5$; $0 \leq d \leq 1$; and $0 \leq e \leq 0.2$. The "A" element, which may be any of the alkaline earth elements Mg, Sr, Ca, and Ba, used either solely or in combination, is very effective in shifting emission wavelength to shorter values. These compounds will be referred to in the present disclosure as "halogenated LAG-based" aluminates, or simply "halogenated aluminates."

In an alternative embodiment, the present yellow to green-emitting, aluminate-based phosphors may be described by the formula $(Y,A)_3(Al,B)_5(O,C)_{12}$:Ce$^{3+}$, where A is at least one of Tb, Gd, Sm, La, Lu, Sr, Ca, and Mg, including combinations of those elements, wherein the amount of substitution of those elements for Y ranges from about 0.1 to about 100 percent in a stoichiometric manner. B is at least one of Si, Ge, B, P, and Ga, including combinations, and these elements substitute for Al in amounts ranging from about 0.1 to about 100 percent stoichiometrically. C is at least one of F, Cl, N, and S, including combinations, substituting for oxygen in amounts ranging from about 0.1 to about 100 percent stoichiometrically.

In an alternative embodiment, the present yellow to green-emitting, aluminate-based phosphors may be described by the formula $(Y_{1-x}Ba_x)_3Al_5(O_{1-y}C_y)_{12}$:Ce$^{3+}$, where x and y each range from about 0.001 to about 0.2.

In an alternative embodiment, a yellow-green to green-emitting, aluminate-based phosphor may be described by the formula $(A_{1-3}{}^{3+}B_x{}^{2+})_mAl_5(O_{1-y}{}^{2-}C_y{}^{1-})_n$:Ce$^{3+}$, where A is selected from the group consisting of Y, Sc, Gd, Tb, and Lu; B is selected from the group consisting of Mg, Sr, Ca, and Ba; C is selected from the group consisting of F, Cl, and Br; $0 \leq x \leq 0.5$; $0 \leq y \leq 0.5$; $2 \leq m \leq 4$; and $10 \leq n \leq 14$.

In an alternative embodiment, a yellow-green to green-emitting, aluminate-based phosphor may be described by the formula $(A_{1-x}{}^{3+}B_x{}^{2+})_mAl_5(O_{1-y}{}^{2-}C_y{}^{1-})_n$:Ce$^{3+}$, where A is selected from the group consisting of Y, Sc, Gd, Tb, and Lu; B is selected from the group consisting of Mg, Sr, Ca, and Ba; C is selected from the group consisting of F, Cl, and Br; $0 \leq x \leq 0.5$; $0 \leq y \leq 0.5$; $2 \leq m \leq 4$; and $10 \leq n \leq 14$; subject to the proviso that m is not equal to 3.

In an alternative embodiment, a yellow-green to green-emitting, aluminate-based phosphor may be described by the formula $(A_{1-x}{}^{3+}B_x{}^{2+})_mAl_5(O_{1-y}{}^{2-}C_y{}^{1-})_n$:Ce$^{3+}$, where A is selected from the group consisting of Y, Sc, Gd, Tb, and Lu; B is selected from the group consisting of Mg, Sr, Ca, and Ba;

C is selected from the group consisting of F, Cl, and Br; $0 \leq x \leq 0.5$; $0 \leq y \leq 0.5$; $2 \leq m \leq 4$; and $10 \leq n \leq 14$; subject to the proviso that n is not equal to 12.

In an alternative embodiment, a yellow to green-emitting, aluminate-based phosphor may be described by the formula $(Lu_{1-x-y}A_xCe_y)_3B_zAl_5O_{12}C_{2z}$, where A is at least one of Sc, La, Gd, and Tb; B is at least one of the alkaline earths Mg, Sr, Ca, and Ba; C is at least one of the halogen elements F, C, Br, and I; and the values of the parameters x, y, z are $0 \leq x \leq 0.5$; $0.001 \leq y \leq 0.2$; and $0.001 \leq z \leq 0.5$. It is noted that "at least one of" with regard to the formulas in this disclosure means that the elements in that group may appear in the phosphor either individually, or in combinations, where any combinations of any of the elements in that group are allowable, provided that the total amount of that group satisfies the rule assigned to it in terms of overall stoichiometric amounts.

One of ordinary skill in the art will appreciate that the relationship between the amounts of C, the halogen, and B, the alkaline earth, may not always be present in the phosphor product at the expected ratio of 2:1 (stoichiometrically speaking) after a processing step such as sintering if the C and B components are added to the starting mix of materials in the form of an alkaline earth salt (e.g., $B^{2+}C_2$). This is because the halogen component is known to be volatile, and in some instances, some of the C is lost relative to B such that the ratio of B to C in the final phosphor product is less than 2:1. Thus, in an alternative embodiment of the present invention, the amount of C is less than 2z in the formula of paragraph [0049] by an amount of up to 5 percent by number. In various other embodiments, the amount of C is less than 2z by an amount of up to 10, 25, and 50 percent stoichiometrically.

Synthesis

Any number of methods may be used to synthesize the present yellow-green to yellow-emitting, aluminate-based phosphors, methods that may involve both solid state reaction mechanisms as well as liquid mixing techniques. Liquid mixing includes such methods as co-precipitation and sol-gel techniques.

One embodiment of preparation involves a solid state reaction mechanism comprising the steps:

(a) desired amounts of the starting materials $CeO_2$, $Y_2O_3$, lutetium salts including the nitrates, carbonates, halides, and/or oxides of lutetium, salts of the other rare earths Sc, La, Gd, and Tb, and $M^{2+}X_2$, where M is a divalent alkaline earth metal selected from the group consisting of Mg, Sr, Ca, and Ba, and X is a halogen selected from the group consisting of F, Cl, Br, and I were combined to form a mixture of starting powders;

(b) the mix of starting powders from step (a) is dry-mixed using any conventional method, such as ball milling, and typical mixing times using ball milling are greater than about 2 hours (in one embodiment about 8 hours);

(c) sintering the mixed starting powders from step (b) at a temperature of about 1400° C. to about 1600° C. for about 6 to about 12 hours in a reducing atmosphere (the purpose of this atmosphere is for a reduction of the ammonia-based compounds);

(d) crushing the sintered product from step (c), and washing it with water; and (e) drying the washed product from step (d), wherein the drying conditions may be constitute a time of about 12 hours at a temperature of about 150° C.

The present aluminates may be synthesized by liquid mixing techniques. An example of the synthesis of a non-halogenated LAG compound having the formula $Lu_{2.985}Ce_{0.015}Al_5O_{12}$ using co-precipitation has been described by H.-L. Li et at in an article titled "Fabrication of Transparent Cerium-Doped Lutetium Aluminum Garnet Ceramics by Co-Precipitation Routes," *J. Am. Ceram. Soc.* 89 [7] 2356-2358 (2006). These non-halogenated LAG compounds contained no alkaline earth constituents. The article is incorporated herein in its entirety, as it is contemplated that a similar co-precipitation method may be used to produce the halogenated LAGs of the present disclosure with alkaline earth constituents.

An example of the synthesis of a halogenated YAG compound using a sol-gel technique has been described in U.S. Pat. No. 6,013,199 by E. McFarland et al., to Symyx Technologies, titled "Phosphor materials." These (possibly) halogenated YAG compounds contained no alkaline earth constituents. This patent is incorporated herein in its entirety, as it is contemplated that a similar sol-gel method may be used to produce the halogenated YAG compounds of the present disclosure with alkaline earth constituents.

FIG. 1 shows the SEM morphology of an exemplary $Lu_{2.91}Ce_{0.09}Al_5O_{12}$ phosphors with different $MgF_2$ additive concentrations, synthesized via the solid state mechanisms described above. The morphology as revealed by scanning electron microscope (SEM) shows that particle sizes become larger, and more homogeneous, as the amount of the $MgF_2$ additive is increased. The phosphor particles are roughly 10 to 15 microns in diameter.

Crystal Structure of the Present Yellow-Green to Yellow Emitting Aluminates

The crystal structure of the present yellow-green to yellow aluminates is similar to that of the yttrium aluminum garnet, $Y_3Al_5O_{12}$, and in keeping with this well studied YAG compound, the present aluminates may belong to the space group Ia3d (no. 230). This space group, as it pertains to YAG, has been discussed by Y Kuru et al. in an article titled "Yttrium Aluminum Garnet as a Scavenger for Ca and Si," *J. Am. Ceram. Sac.* 91 [11] 3663-3667 (2008). As described by Y. Kuru et al., YAG has a complex crystal consisting of 160 atoms (8 formula units) per unit cell, where the $Y^{3+}$ occupy positions of multiplicity 24, Wyckoff letter "c," and site symmetry 2.22, and the $O^{2-}$ atoms occupy positions of multiplicity 96, Wyckoff letter "h," and site symmetry 1. Two of the $Al^{3+}$ ions are situated on octahedral 16(a) positions, whereas the remaining three $Al^{3+}$ ions are positioned on tetrahedral 24(d) sites.

The lattice parameters of the YAG unit cell are $a=b=c=1.2008$ nm, and $\alpha=\beta=\gamma=90°$. Whereas substitution of lutetium for yttrium is expected to expand the size of the unit cell, the angles between the unit cell axes are not expected to change, and the material will retain its cubic character.

Figure 2:
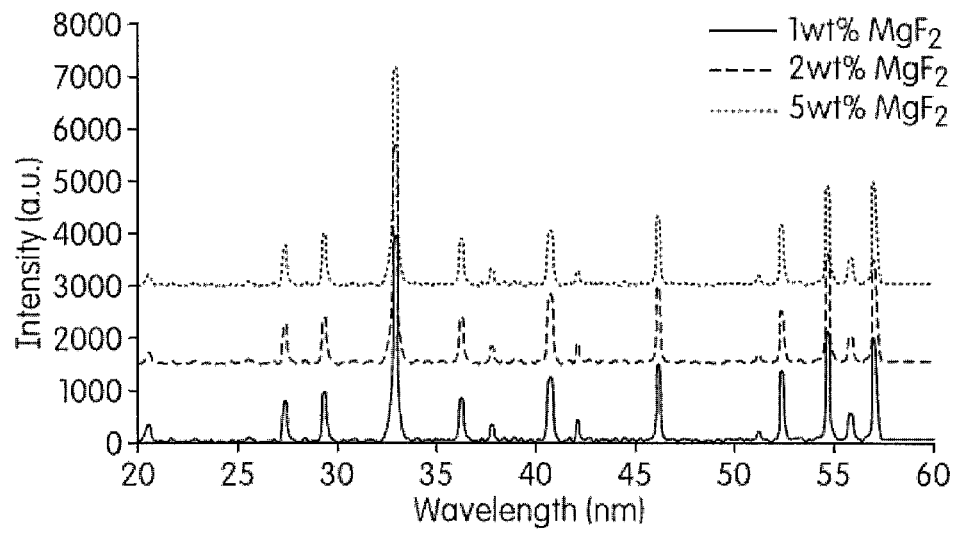
FIG. 2 is a series of x-ray diffraction (XRD) patterns of exemplary $Y_{2.91}Ce_{0.09}Al_5O_{12}$ phosphors with different $MgF_2$ additive concentrations.

FIG. 2 shows the x-ray diffraction (XRD) patterns of a series of exemplary $Y_{2.91}Ce_{o09}Al_5O_{12}$ phosphors with different $MgF_2$ additive concentrations, showing how the addition of an alkaline earth and a halogen ($MgF_2$) component shifts high angle diffraction peaks to higher values of 2θ. This means that the lattice constants become smaller relative to a YAG component with no alkaline earth/halogen, and further indicates that $Mg^{2+}$ is being incorporated into the crystal lattice, occupying $Y^{3+}$ positions.

Figure 3:
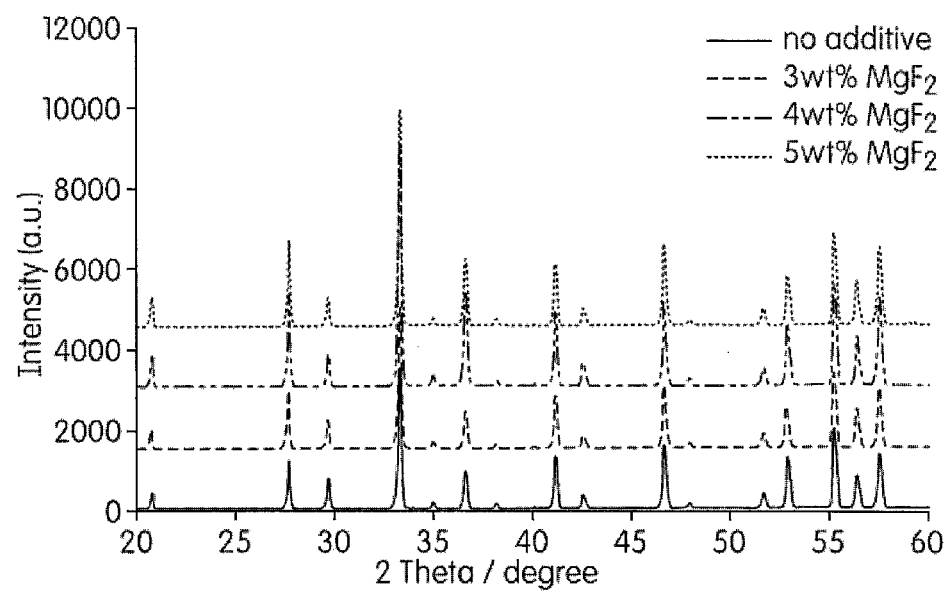
FIG. 3 is a series x-ray diffraction (XRD) patterns of exemplary $Lu_{2.91}Ce_{0.09}Al_5O_{12}$ phosphors with different $MgF_2$ additive concentrations.

FIG. 3 shows the x-ray diffraction (XRD) pattern of a series of exemplary phosphors in an analogous manner to FIG. 2, except that this time the series of compounds are $Lu_{2.91}Ce_{0.09}Al_5O_{12}$ phosphors with different $MgF_2$ additive concentrations, where lutetium-based compounds are being studied, rather than yttrium-based compounds.

Figure 4:
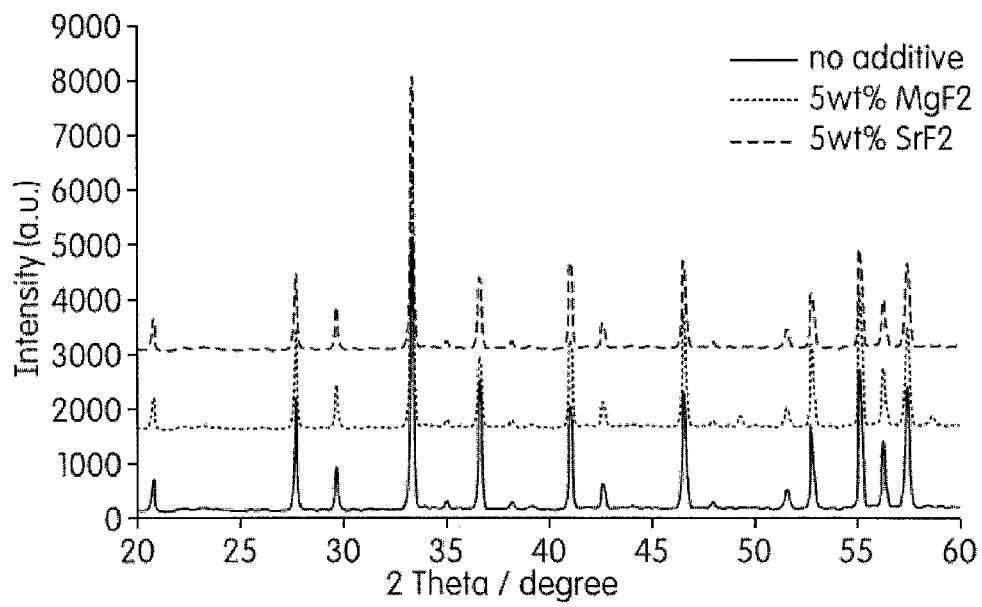
FIG. 4 is a series of the x-ray diffraction (XRD) patterns of exemplary $Lu_{2.91}Ce_{0.09}Al_5O_{12}$ phosphors having a 5 wt % $MgF_2$ additive and a 5 wt % $SrF_2$ additive.

FIG. 4 shows the x-ray diffraction (XRD) pattern of a series of exemplary $Lu_{2.91}Ce_{0.09}Al_5O_{12}$ phosphors having either a 5 wt % $MgF_2$ and 5 wt % $SrF_2$ additive: this experiment shows a comparison of the Mg constituent versus an Sr constituent. The data shows that with the $MgF_2$ additive in the $Lu_{2.91}Ce_{0.09}Al_5O_{12}$ lattice, high angle diffraction peak move to greater values of 2θ, meaning that lattice constants become smaller. Alternatively, with $SrF_2$ additive, high angle diffraction peaks move to smaller values of 2θ, meaning that the lattice constants increase. It will be apparent to those skilled in the art that both $Mg^{2+}$ and $Sr^{2+}$ are being incorporated into the $Lu_{2.91}Ce_{0.09}Al_5O_{12}$ lattice and occupying $Lu^{3+}$ positions. These peak shifts in position occur because $Mg^{2+}$, with its ionic radius of 0.72 Å, is smaller than $Lu^{3+}$ (0.86 Å), while $Sr^{2+}$ (1.18 Å) is bigger than $Lu^{3+}$.

Mechanism of Alkaline Earth and Halogen Influence on Optical Properties

In one embodiment of the present invention, $Ce^{3+}$ is the luminescent activator in the aluminate-based phosphor. The transition between the 4f and 5d energy levels of the $Ce^{3+}$ ion corresponds to excitation of the phosphor with blue light; green light emission from the phosphor is a result from the same electronic transition. In the aluminate structure, the $Ce^{3+}$ is located at the center of an octahedral site formed by a polyanionic structure of six oxygen ions. It will be appreciated by those skilled in the art that according to crystal field theory, the surrounding anions (which may also be described as ligands) induce an electrostatic potential on the 5d electron of the central cation. The 5d energy level splitting is 10Dq, where Dq is known to depend on the particular ligand species. From the spectrochemical series it may be seen that the Dq of a halide is smaller than that of oxygen, and thus it follows that when oxygen ions are replaced by halide ions, the Dq will decrease correspondingly.

The implications of this are that the band gap energy; that is to say, the energy difference between the 4f and 5d electronic levels, will increase with substitution of oxygen ions with halide in the polyanionic cages surrounding activator ions. This is why the emission peak shifts to shorter wavelength with halogen substitution. Simultaneously, with the introduction of halide ions in the oxygen polyanionic structures forming octahedral sites, a corresponding cation may also replace a portion of the Lu (and/or Sc, La, Gd, and Tb) content. If the cation replacing Lu (and/or the other rare earths) is a smaller cation, the result will be a shift of the emission peak towards the blue end of the spectrum. The emitted luminescence will have a shorter wavelength than otherwise would have occurred. In contrast, if the cation replacing Lu is a larger cation, such as Sr or Ba, the result will be a shift of the emission peak towards the red end of the spectrum. In this case, the emitted luminescence will have a longer wavelength.

Combined with the effects of the halide, Mg as an alkaline earth substituent will be a better choice than Sr if a blue-shift is desired, and this will be shown experimentally in the following portions of the present disclosure. It is also known the LAG emission peak is a doublet due to spin-orbit coupling. As the blue-shift occurs, the emission with shorter wavelength is biased and its intensity increases correspondingly. This trend is not only helpful to the blue-shift of the emission, but also enhances photoluminescence.

Figure 5:
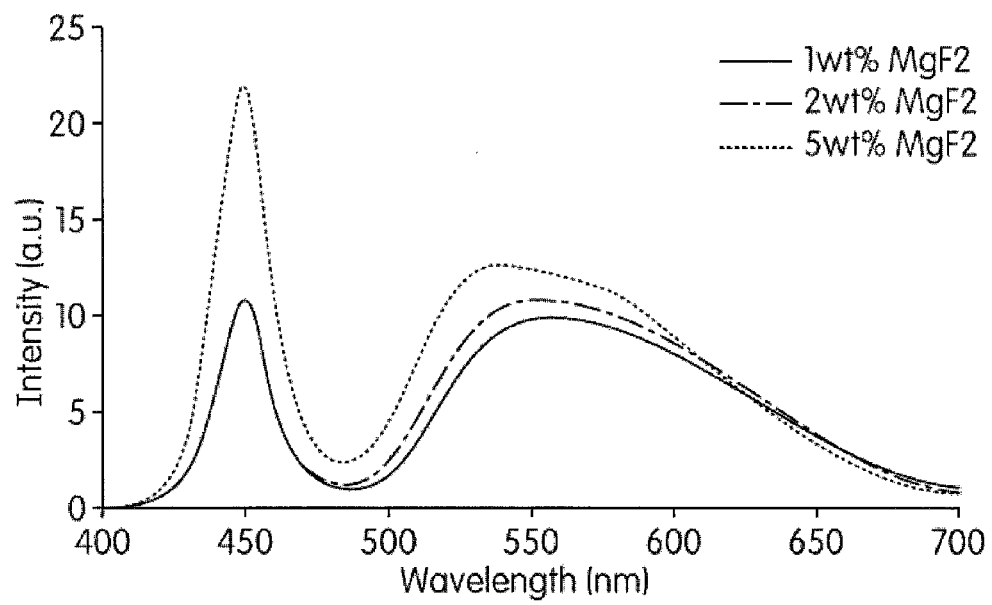
FIG. 5 is the emission spectra of a series of exemplary $Y_{2.91}Ce_{0.09}Al_5O_{12}$ phosphors with different levels of $MgF_2$ additive, the emission spectra are obtained by exciting the phosphors with a blue LED.

FIG. 5 is the emission spectra of a series of exemplary $Y_{2.91}Ce_{0.09}Al_5O_{12}$ phosphors with different levels of $MgF_2$ additive, the emission spectra obtained by exciting the phosphors with a blue LED. This data shows that with increasing amounts of MgF2 the photoluminescent intensity increases and the peak emission wavelength shifts to shorter values. Though not shown on FIG. 5, the present inventors have data for a 5 wt % addition of $BaF_2$ to the starting powders: this phosphor showed a significant increase in photoluminescent intensity relative to the three magnesium-containing phosphors, and a peak emission wavelength that the same about as that of the 1 wt % sample.

Figure 6:
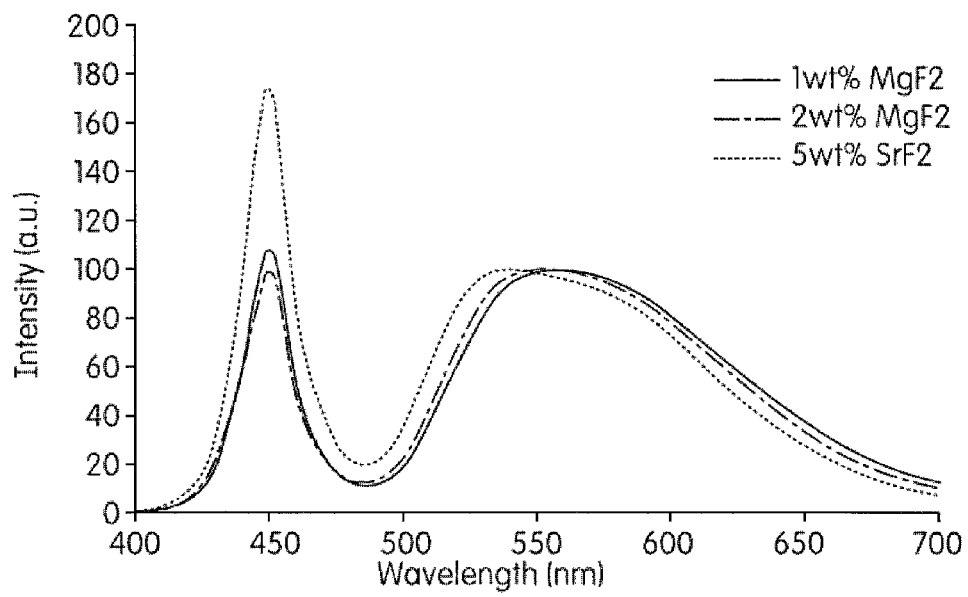
FIG. 6 is the normalized emission spectra of a series of exemplary $Lu_{2.91}Ce_{0.09}Al_5O_{12}$ phosphors with different $MgF_2$ additive concentrations under blue LED excitation.

A normalized version of the data from FIG. 5 is shown in FIG. 6. FIG. 6 is the normalized emission spectra of the same series of exemplary $Lu_{2.91}Ce_{0.09}Al_5O_{12}$ phosphors with different $MgF_2$ additive concentrations under blue LED excitation, but where normalizing the photoluminescent intensity to a single value highlight that the emission peak of $Y_{2.91}Ce_{0.09}Al_5O_{12}$ shifts to short wavelength with increasing amounts of the $MgF_2$ additive. The greater the amount of the $MgF_2$ additive, the shorter emission peak wavelength. This is the same trend with demonstrated by a $Lu_{2.91}Ce_{0.09}Al_5O_{12}$ phosphor, as will be demonstrated next.

Figure 7:
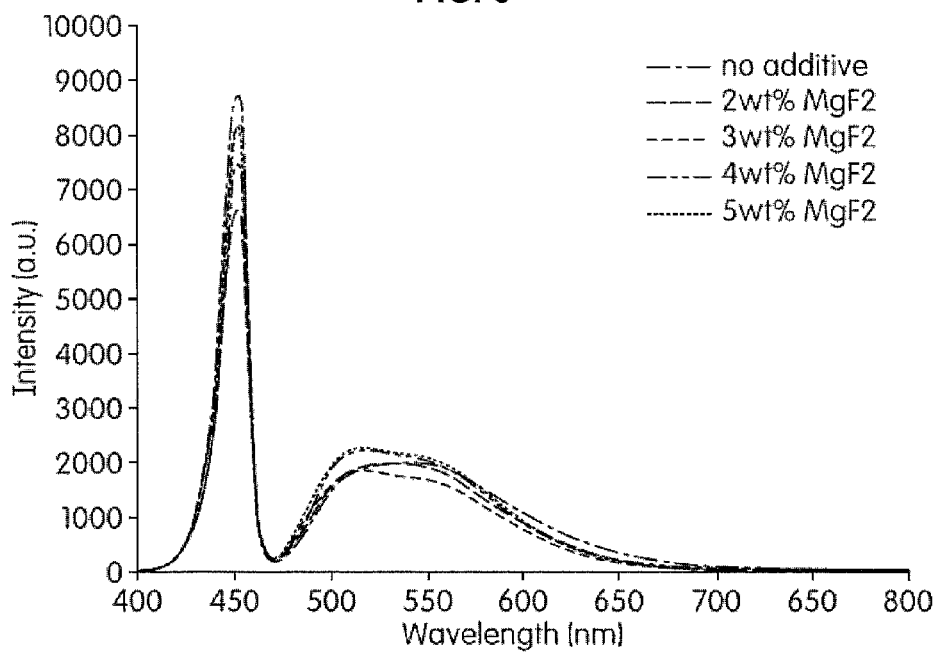
FIG. 7 is the emission spectra of $Lu_{2.91}Ce_{0.09}Al_5O_{12}$ phosphors with different $MgF_2$ additive concentrations under blue LED excitation.

FIG. 7 is the emission spectra of a series of exemplary $Lu_{2.91}Ce_{0.09}Al_5O_{12}$ phosphors with different levels of $MgF_2$ additive, the emission spectra obtained by exciting the phosphor with a blue LED. This data is analogous to that of FIG. 5, except that lutetium-based rather than yttrium-based compounds are being studied. As with the yttrium data, this data for lutetium shows similar trends for the shift in emission wavelength, though those trends for photoluminescent intensity are not, perhaps, as similar.

Figure 8:
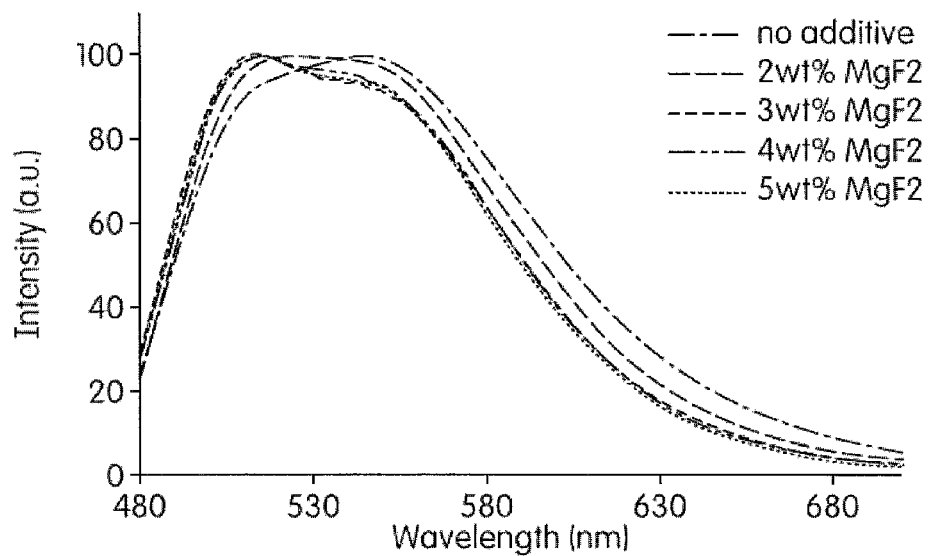
FIG. 8 is the normalized emission spectra of $Lu_{2.91}Ce_{0.09}Al_5O_{12}$ phosphors with different levels of $MgF_2$ additive under blue LED excitation; the results show that the emission peak of $Lu_{2.91}Ce_{0.09}Al_5O_{12}$ shifts to shorter wavelength with a certain amount of $MgF_2$ additive, and that the greater the amount of the $MgF_2$ additive, the shorter the emission peak wavelength.

The $Lu_{2.91}Ce_{0.09}Al_5O_{12}$ emission spectra of FIG. 7 has been normalized to emphasize the effect of the addition of halogen salt on peak emission wavelength; the normalized version of the data is shown in FIG. 8. As in the yttrium case, peak emission shifts to shorter wavelength with increasing amounts of $MgF_2$ additive; that is to say, the greater the amount of the $MgF_2$ additive, the shorter emission peak wavelength. The amount of wavelength shift upon increasing the amount of the MgF2 additive from zero (no additive) to about 5 wt % of the additive was observed to be about 40 nm; from about 550 nm to about 510 nm.

Each of the graphs in FIGS. 5-8 have plotted their respective spectra as a series of phosphor compositions with increasing additive concentration, starting at no additive, and ending with the highest concentration of the series at 5 wt %. To emphasize a comparison of the $SrF_2$ additive with the $MgF_2$ additive; in other words, a phosphor with an Sr alkaline earth and fluorine content with a phosphor having a Mg alkaline earth and fluorine content, the phosphors have been plotted together in FIG. 9: a phosphor with no additive, a phosphor with 5 wt % $SrF_2$, and a phosphor with 5 wt % $MgF_2$. The phosphor is based on the sample $Lu_{2.91}Ce_{0.09}Al_5O_{12}$.

Figure 9:
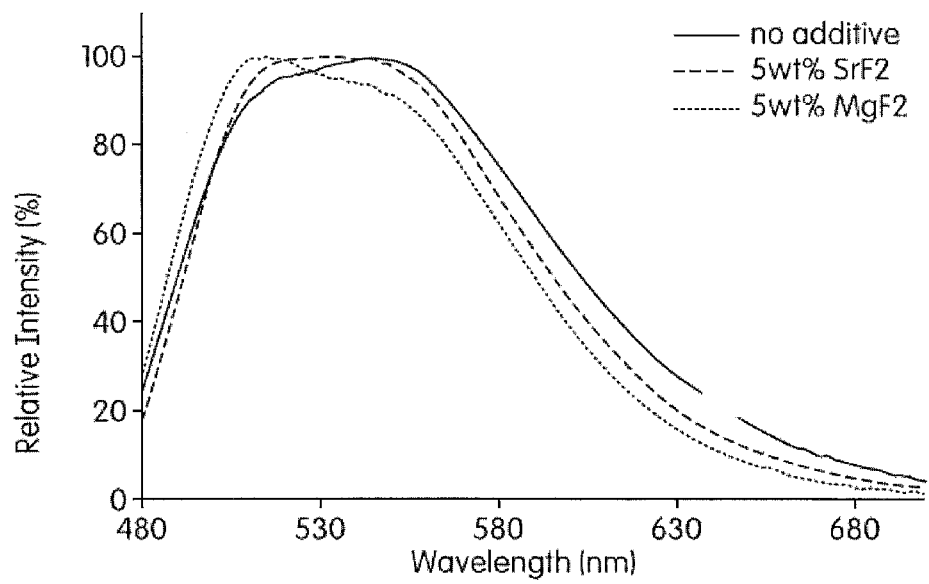
FIG. 9 is a normalized emission spectra of a $Lu_{2.91}Ce_{0.09}Al_5O_{12}$ phosphor with 5 wt % $MgF_2$ and 5 wt % $SrF_2$ additives where the phosphor has been excited with a blue LED; the results are compared with a control sample that contains no halogenated salt additives; the results illustrate that the emission peak shifts to shorter wavelengths with the $MgF_2$ synthesized compound than it does for the $SrF_2$ synthesized compound.

The emission spectra data in FIG. 9 has been normalized to better emphasize the effects on optical properties rendered by the inclusion the halogen and alkaline earths. When excited with a blue LED, the result illustrates that the emission peak shift to shorter wavelengths with the addition of $MgF_2$ and $SrF_2$. The $Lu_{2.91}Ce_{0.09}Al_5O_{12}$ sample with no additive shows a peak emission wavelength at about 550 nm; with a 5 wt % $SrF_2$ additive the peak emission wavelength shifts to about 535 nm, and with a 5 wt % $MgF_2$ additive the wavelength shifts even further to about 510 nm.

Figure 10:
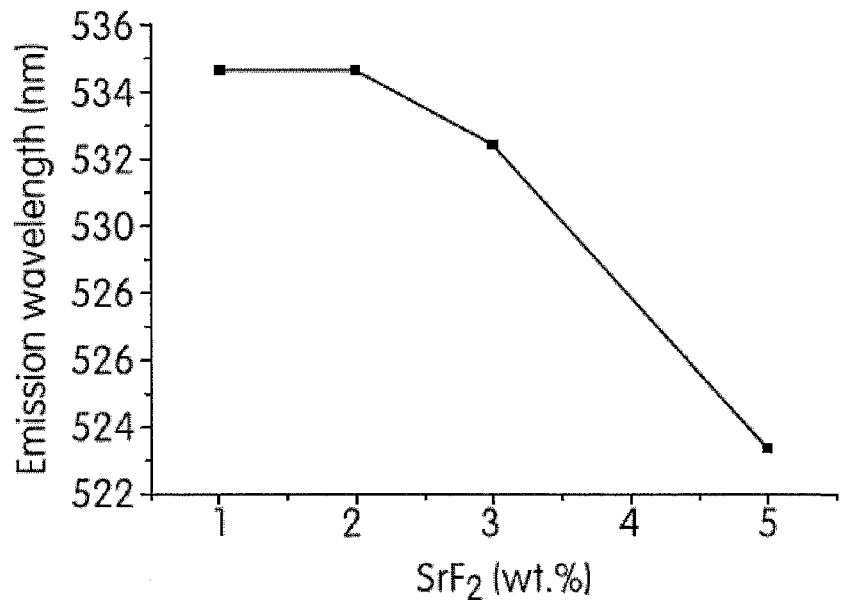
FIG. 10 shows how the emission wavelength of a series of exemplary $Lu_{2.91}Ce_{0.09}Al_5O_{12}$ phosphors decreases as the concentration of an $SrF_2$ additive is increased.

FIG. 10 shows how the emission wavelength of a series of exemplary $Lu_{2.91}Ce_{0.09}Al_5O_{12}$ phosphors decreases as the concentration of an $SrF_2$ additive is increased. Peak emission wavelength has been plotted as a function of the amount of the $SrF_2$ additive; samples having an $SrF_2$ additive content of 1, 2, 3, and 5 wt % were tested. The results show that the peak emission wavelength was about the same for the 1 and 2 wt % samples, the wavelength being about 535 nm; as the $SrF_2$ additive is increased to 3 wt % the peak emission wavelength decreases to about 533 nm. With a further increase of $SrF_2$ additive to 5 wt % peak wavelength drops precipitously to about 524 nm.

Excitation Spectra and Temperature Dependence

Figure 11:
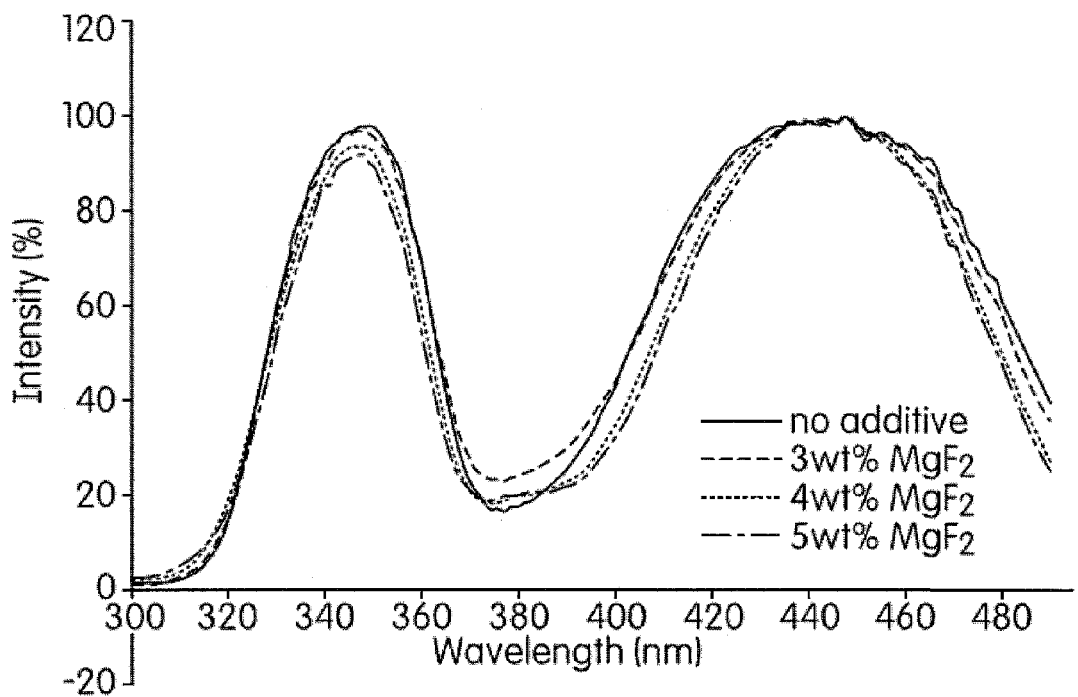
FIG. 11 is the normalized excitation spectra of a series of exemplary $Lu_{2.91}Ce_{0.09}Al_5O_{12}$ phosphors with different $MgF_2$ additive concentrations, showing that the excitation spectrum becomes narrower as the $MgF_2$ additive concentration is increased.

FIG. 11 is the normalized excitation spectra of a series of exemplary $Lu_{2.91}Ce_{0.09}Al_5O_{12}$ phosphors with different $MgF_2$ additive concentrations, showing that the excitation spectra becomes more narrow when the $MgF_2$ additive concentration is increased. The data shows that the present green emitting, aluminate-based phosphors exhibit a wide band of wavelengths over which the phosphors may be excited, ranging from about 380 to about 480 nm.

Figure 12:
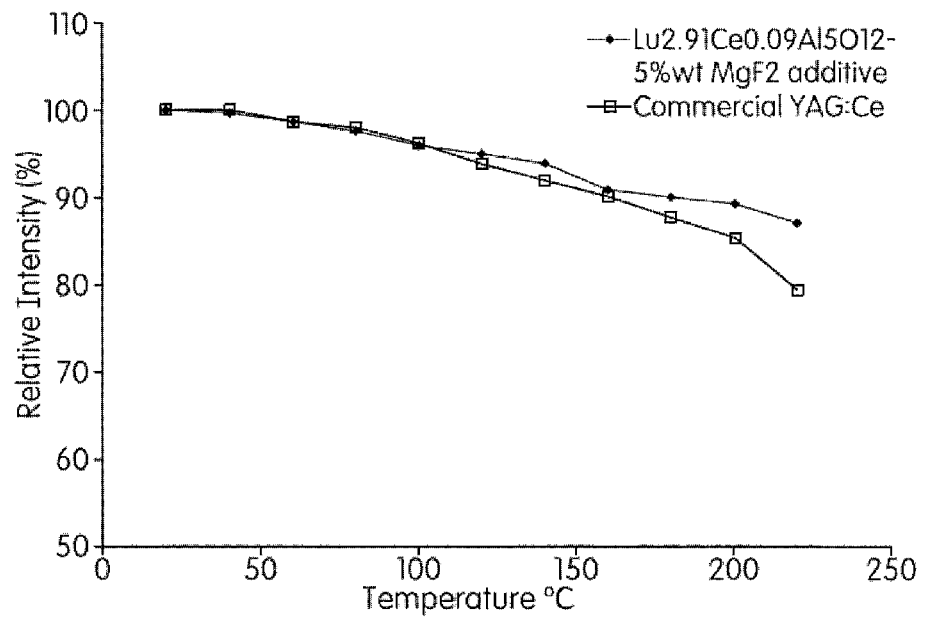
FIG. 12 shows the temperature dependence of an exemplary $Lu_{2.91}Ce_{0.09}Al_5O_{12}$ phosphor with a 5 wt % $MgF_2$ additive, as compared with a commercial Ce:YAG phosphor.

The thermal stability of the present garnet phosphors is exemplified by the lutetium containing compound $Lu_{2.91}Ce_{0.09}Al_5O_{12}$ with a 5 wt % $MgF_2$ additive; its thermal stability is compared with the commercially available phosphor $Ce^{3+}:Y_3Al_5O_{12}$ in FIG. 12. It may be observed that the thermal stability of the $Lu_{2.91}Ce_{0.09}Al_5O_{12}$ compound is even better than the YAG.

Applications to Backlighting and White Light Illumination Systems

According to further embodiments of the present invention, the present green emitting, aluminate-based phosphors may be used in white light illumination systems, commonly known as "white LEDs," and in backlighting configurations for display applications. Such white light illumination systems comprise a radiation source configured to emit radiation having a wavelength greater than about 280 nm; and a halide anion-doped green aluminate phosphor configured to absorb at least a portion of the radiation from the radiation source, and emit light having a peak wavelength ranging from 480 nm to about 650 nm.

Figure 13:
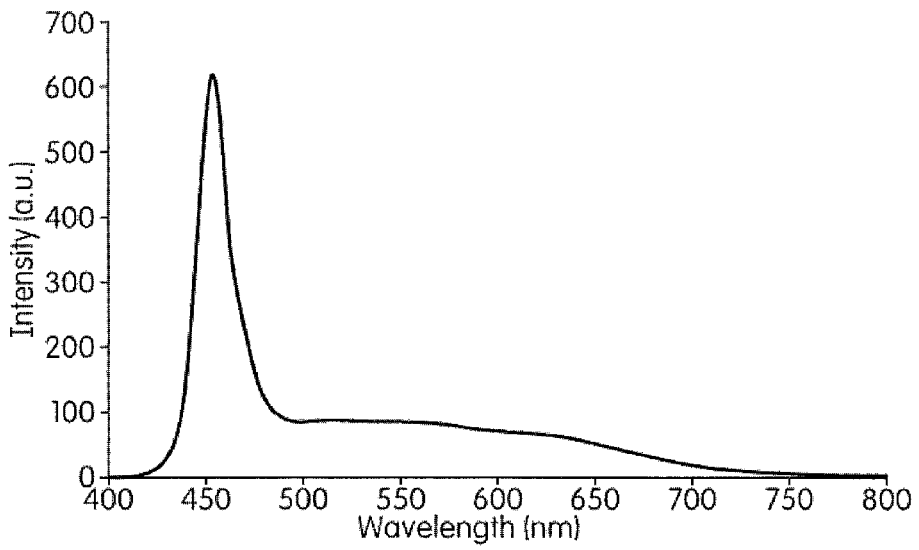
FIG. 13 shows the spectra of a white LED that includes an exemplary green-emitting, aluminate-based phosphor having the formula $Lu_{2.91}Ce_{0.09}Al_5O_{12}$ with 5 wt % $SrF_2$ additive; the white LED also includes a red phosphor having the formula $(Ca_{0.2}Sr_{0.8})AlSiN_3:Eu^{2+}$, and when both green and red phosphors are excited with an InGaN LED emitting blue light, the resulting white light had the color properties CIE x=0.24, and CIE y=0.20.

FIG. 13 shows the spectra of a white LED that includes an exemplary green-emitting, aluminate-based phosphor having the formula $Lu_{2.91}Ce_{0.09}Al_5O_{12}$ with a 5 wt % $SrF_2$ additive. This white LED further includes a red phosphor having the formula $(Ca_{0.2}Sr_{0.8})AlSiN_3:Eu^{2+}$ When both green aluminate and red nitride phosphors are excited with an InGaN LED emitting blue light, the resulting white light displayed the color coordinates CIE x=0.24, and CIE y=0.20.

Figure 14:
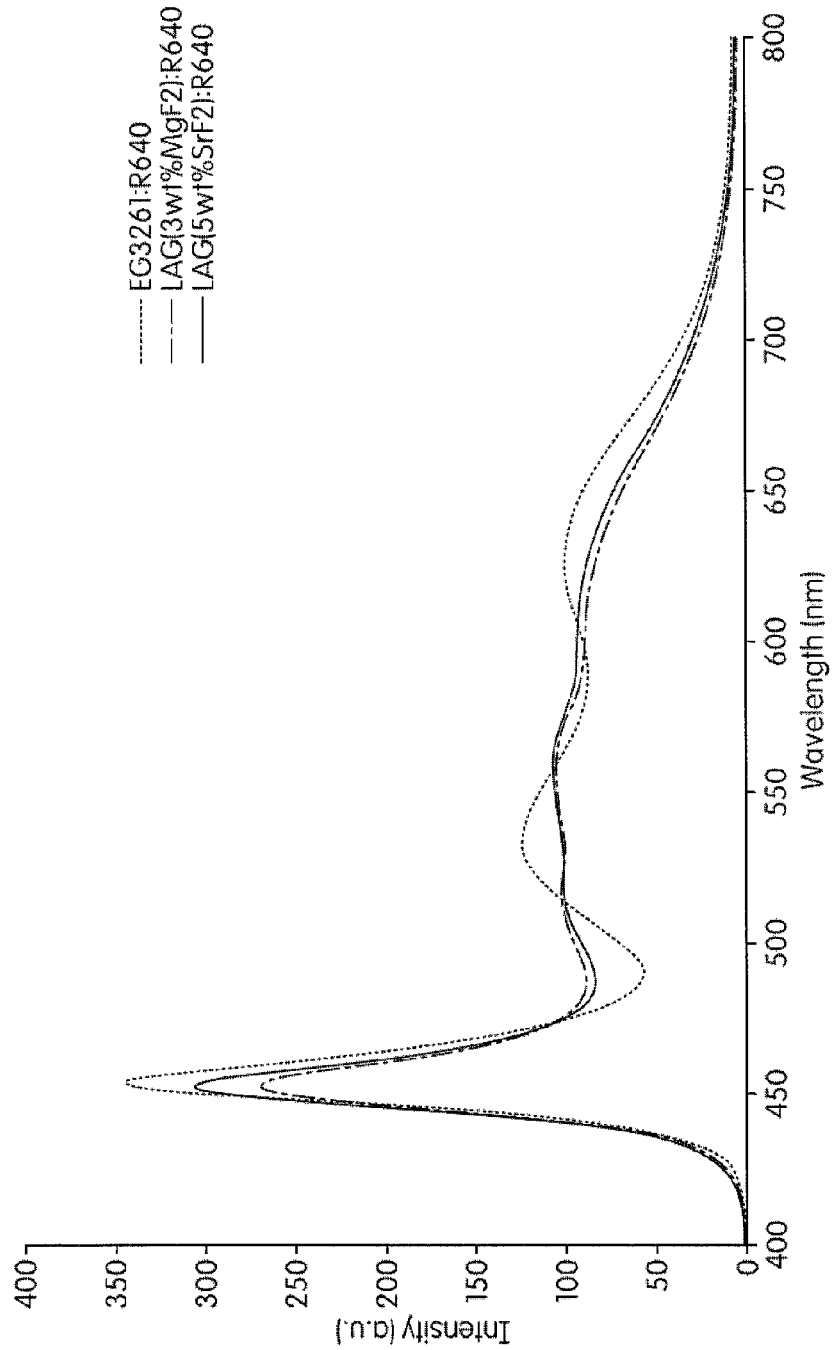
FIG. 14 is the spectra of a white LED with the following components: a blue InGaN LED, a green garnet having the formula $Lu_{2.91}Ce_{0.09}Al_5O_{12}$ with either 3 or 5 wt % additives of $MgF_2$ and $SrF_2$, respectively, a red nitride having the formula $(Ca_{0.2}Sr_{0.8})AlSiN_3:Eu^{2+}$ or a silicate having the formula $(Sr_{0.5}Ba_{0.5})_2SiO_4:Eu^{2+}$, wherein the white light has the color coordinates CIE (x=0.3, y=0.3)

FIG. 14 is the spectra of a white LED with the following components: a blue InGaN LED, a green garnet having the formula $Lu_{2.91}Ce_{0.09}Al_5O_{12}$ with either 3 or 5 wt % additives, a red nitride having the formula $(Ca_{0.2}Sr_{0.8})AlSiN_3:Eu^{2+}$ or a silicate having the formula $(Sr_{0.5}Ba_{0.5})_2SiO_4:Eu^{2+}$, wherein the white light has the color coordinates CIE (x=0.3, y=0.3). The sample that shows the most prominent double peak is the one labeled "EG3261+R640," where the EG3261 designation represents the $(Sr_{0.5}Ba_{0.5})_2SiO_4:Eu^{2+}$ phosphor, in combination with the red R640 $(Ca_{0.2}Sr_{0.8})AlSiN_3:Eu^{2+}$ phosphor emitting at about 640 nm. The two peaks labeled LAG (3 wt % $MgF_2$)+R640 and LAG (5 wt % $SrF_2$)+R640 demonstrate a much more uniform emission of perceived white light over the wavelength range 500 to 650 nm, an attribute desirable in the art.

Figure 15:
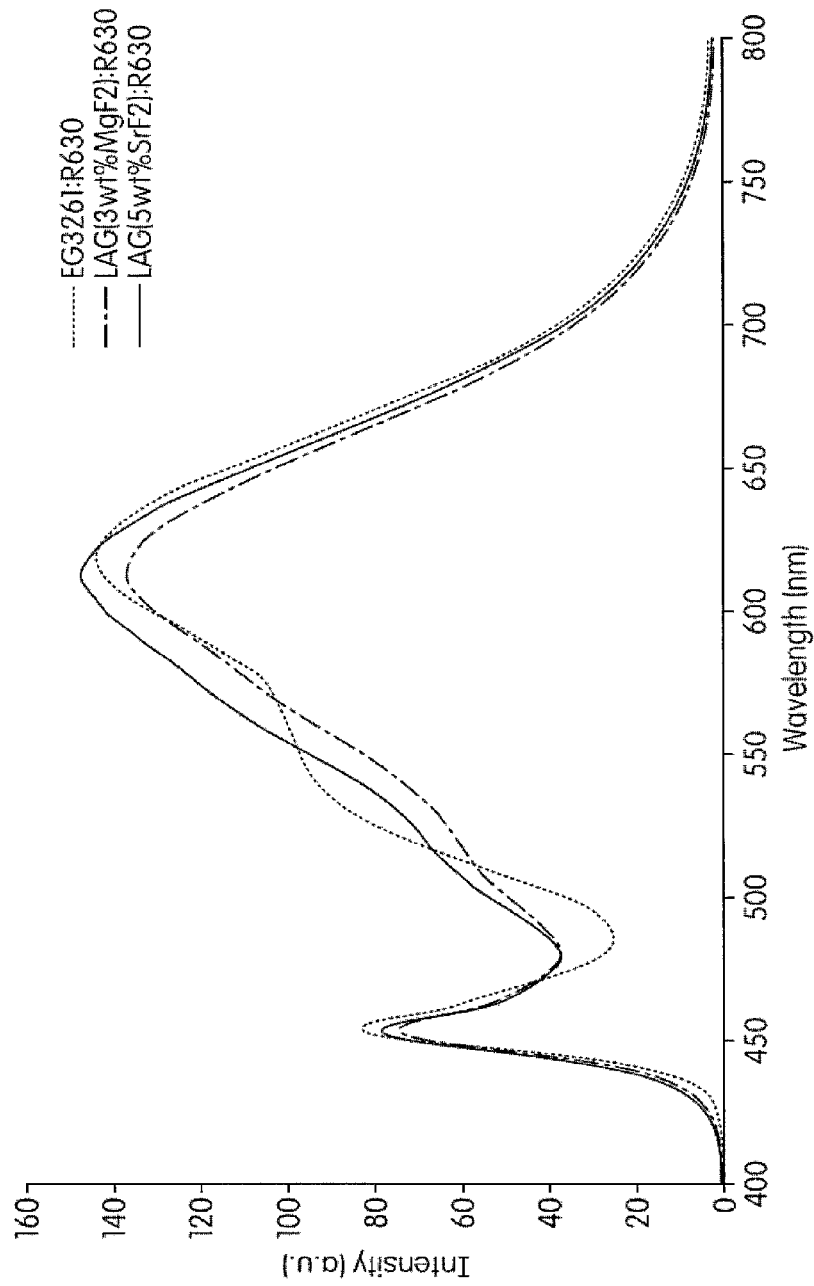
FIG. 15 is the spectra of the white LED systems of FIG. 14, in this instance measured at 3,000 K.

FIG. 15 is the spectra of the white LED systems of FIG. 14, in this instance measured at 3,000 K.

In embodiments of the present invention, the red nitride that may be used in conjunction with the green aluminate may have the general formula $(Ca,Sr)AlSiN_3:Eu^{2+}$, where the red nitride may further comprise an optional halogen, and wherein the oxygen impurity content of the red nitride phosphor may be less than equal to about 2 percent by weight. The yellow-green silicates may have the general formula $(Mg,Sr,Ca,Ba)_2SiO_4:Eu^{2+}$, where the alkaline earths may appear in the compound either individually, or in any combination, and wherein the phosphor may be halogenated by F, Cl, Br, or I (again, either individually, or in any combination).

Optical and Physical Data in Table Form

A summary of exemplary data is tabulated in Tables 1 & 2. In Table 1 is the testing results of a $Lu_{2.91}Ce_{0.09}Al_5O_{12}$ based phosphor with three different $MgF_2$ additive levels. Table 2 tabulates the testing results of a $Lu_{2.91}Ce_{0.09}Al_5O_{12}$ based compound with four different $SrF_2$ additive. These results summarize and confirm that $MgF_2$ and $SrF_2$ additives in $Lu_{2.91}Ce_{0.09}Al_5O_{12}$ shift the emission peak wavelength to shorter wavelengths, where the emission intensity is increased with increasing $MgF_2$ and $SrF_2$ concentration. The particle size also increases with the increasing $MgF_2$ and $SrF_2$ additive concentration.

TABLE 1

Testing results of $Lu_{2.91}Ce_{0.09}Al_5O_{12}$ with different $MgF_2$ levels of additive

| $MgF_2$ (wt %) | CIE x | CIE y | Emission Peak Wavelength (nm) | Relative Intensity (%) | Particle Size D50 (um) |
|---|---|---|---|---|---|
| 1 | 0.3635 | 0.5862 | 526.88 | 58.04 | 4.01 |
| 2 | 0.3554 | 0.5778 | 529.56 | 78.47 | 7.38 |
| 3 | 0.3336 | 0.5776 | 514.22 | 105.13 | 9.30 |

TABLE 2

Testing results of $Lu_{2.91}Ce_{0.09}Al_5O_{12}$ with different levels of $SrF_2$ additive

| $SrF_2$ (wt %) | CIE x | CIE y | Emission Peak Wavelength (nm) | Relative Intensity (%) | Particle Size D50 (um) |
|---|---|---|---|---|---|
| 1 | 0.3677 | 0.5732 | 534.64 | 71.65 | 3.84 |
| 2 | 0.3677 | 0.5732 | 534.64 | 85.82 | 5.24 |
| 3 | 0.3555 | 05718 | 532.43 | 112.40 | 9.90 |
| 5 | 0.3405 | 0.5748 | 523.44 | 107.67 | 11.38 |

Yellow-Green to Yellow Emitting, Rare Earth Doped Aluminate-Based Phosphors

The rare earth doping of a specific series of yellow-green to yellow emitting, halogenated aluminates were tested by the present inventors, where the phosphors had the general formula $(Lu_{1-x-y}A_xCe_y)_3B_zAl_5O_{12}C_{2z}$. As disclosed above, A is at least one of Sc, La, Gd, and Tb; B is at least one of the alkaline earths Mg, Sr, Ca, and Ba; C is at least one of the halogen elements F, C, Br, and I; and the values of the parameters x, y, z are $0 \leq x \leq 0.5$; $0.001 \leq y \leq 0.2$; and $0.001 \leq z \leq 0.5$. In this series of phosphors, the rare earth dopant was Gd, and the alkaline earth was either Ba or Sr. The halogen was F in all of the compounds tested in this series of experiments. The formulas of the specific aluminates tested are shown in Table 3.

TABLE 3

Testing results of $(Lu_{1-x-y}Gd_xCe_y)_3B_zAl_5O_{12}F_{2z}$ with B = Ba and B = Sr for different values of x, y and z

| Composition | CIE x | CIE y | Emission Peak Wavelength (nm) | Relative PL Intensity (%) | Particle Size D50 (μm) |
|---|---|---|---|---|---|
| $(Lu_{0.90}Gd_{0.07}Ce_{0.03})_3Ba_{0.15}Al_5O_{12}F_{0.30}$ | 0.424 | 0.543 | 554 | 114 | 12.02 |
| $(Lu_{0.80}Gd_{0.17}Ce_{0.03})_3Ba_{0.15}Al_5O_{12}F_{0.30}$ | 0.453 | 0.525 | 565 | 111 | 11.15 |
| $(Lu_{0.64}Gd_{0.33}Ce_{0.03})_3Ba_{0.15}Al_5O_{12}F_{0.30}$ | 0.480 | 0505 | 576 | 101 | 9.59 |
| $(Lu_{0.94}Gd_{0.03}Ce_{0.03})_3Sr_{0.34}Al_5O_{12}F_{0.68}$ | 0.413 | 0.550 | 551 | 132 | 15.61 |
| $(Lu_{0.90}Gd_{0.07}Ce_{0.03})_3Sr_{0.34}Al_5O_{12}F_{0.68}$ | 0.429 | 0.545 | 555 | 138 | 12.94 |
| $(Lu_{0.84}Gd_{0.13}Ce_{0.03})_3Sr_{0.34}Al_5O_{12}F_{0.68}$ | 0.436 | 0.537 | 558 | 122 | 14.44 |

For the purpose of this disclosure, a green emission will be defined as having a peak emission wavelength of from about 500 nm to about 550 nm. Emissions extending from about 550 nm to about 600 nm may be described as containing wavelengths that change from a yellow-green color to a yellow color. The addition of Gd doping converts the phosphor from a substantially green-emitting sample to a substantially yellow sample in the experiments described; though not shown, increasing the Gd concentration even further (from about 0.33 for Ba samples and from about 0.13 for Sr samples) shifts the emission further towards and into the yellow region of the electromagnetic spectrum. Making generalizations can be difficult because the peak emission wavelength depends not only on the choice and level of the rare earth(s) dopants present in addition to lutetium (e.g., Gd in addition to Lu), but also on the selection and amounts of the included alkaline earth(s) and the halogen(s). The halogenated aluminates in the present disclosure are defined to emit in the yellow-green to the yellow region of the electromagnetic spectrum, at wavelengths from about 550 nm to about 600 nm. Green-emitting halogenated aluminates emit at peak wavelengths ranging substantially from about 500 nm to about 550 nm. For green-emitting aluminates, see U.S. patent application Ser. No. 13/181,226 filed Jul. 12, 2011, assigned to the same assignee as the present application, and hereby incorporated herein in its entirety.

Figure 16A:
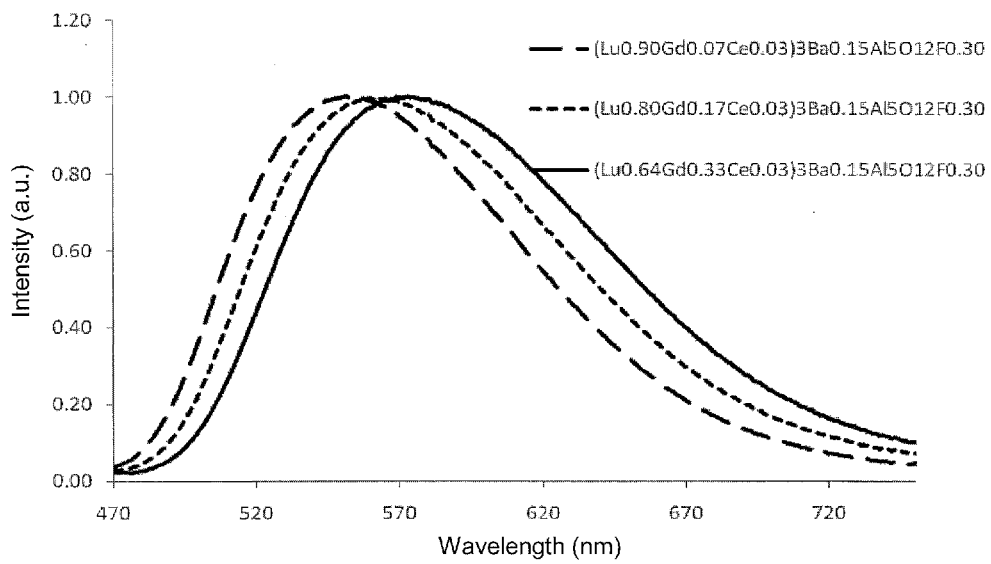
FIGS. 16A-B shows that the peak emission wavelength of these halogenated aluminates ranged overall from about 550 nm to about 580 nm as the Gd level was increased, where the Ba level was fixed stoichiometrically at 0.15 for the Ba series, and where the Sr level was fixed stoichiometrically at 0.34.
Figure 16B:
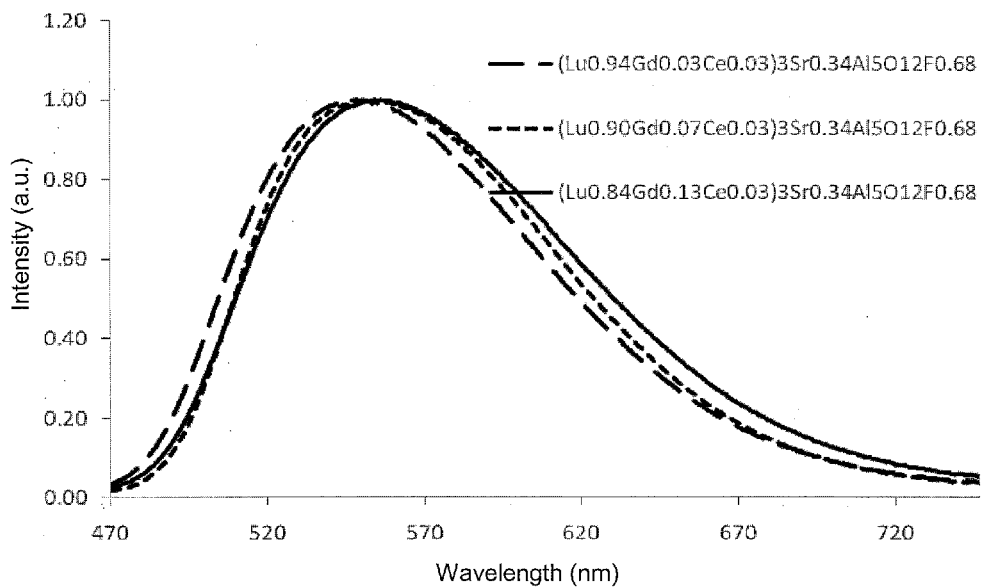

The data in Table 3 and FIGS. 16A-B shows that the peak emission wavelength of these halogenated aluminates ranged overall from about 550 nm to about 580 nm as the Gd level was increased, where the Ba level was fixed stoichiometrically at 0.15 for the Ba series, and where the Sr level was fixed stoichiometrically at 0.34 for the Sr series (the concentration is stoichiometric, meaning by number, not by weight). The Ce activator level was also fixed stoichiometrically at 0.03 for all of the samples. Specifically, for the Ba samples, the peak emission wavelength increased from 554 nm to 565 nm to 576 nm as the Gd amount was increased stoichiometrically from 0.07 to 0.17 to 0.33, respectively. For the Sr samples, the peak emission wavelength increased from 551 nm to 555 nm to 558 nm as the Gd amount was increased stoichiometrically from 0.03 to 0.07 to 0.13, respectively.

The actual compounds in the Ba series were, respectively, $(Lu_{0.90}Gd_{0.07}Ce_{0.03})_3Ba_{0.15}Al_5O_{12}F_{0.30}$, $(Lu_{0.80}Gd_{0.17}Ce_{0.03})_3Ba_{0.15}Al_5O_{12}F_{0.30}$, and $(Lu_{0.64}Gd_{0.33}Ce_{0.03})_3Ba_{0.15}Al_5O_{12}F_{0.30}$. The actual compounds tested in the Sr series were, respectively, $(Lu_{0.94}Gd_{0.03}Ce_{0.3})_3Sr_{0.34}Al_5O_{12}F_{0.68}$, $(Lu_{0.90}Gd_{0.07}Ce_{0.03})_3Sr_{0.34}Al_5O_{12}F_{0.68}$, and $(Lu_{0.84}Gd_{0.13}Ce_{0.03})_3Sr_{0.34}Al_5O_{12}F_{0.68}$.

It is noted that the Sr series emitted at a higher relative photoluminescent intensity when compared to the Ba series, but one skilled in the art will know to draw conclusions carefully, as several other variables were changed at the same time (e.g., Gd content, alkaline earth amounts, and halogen concentrations).

Figure 17A:
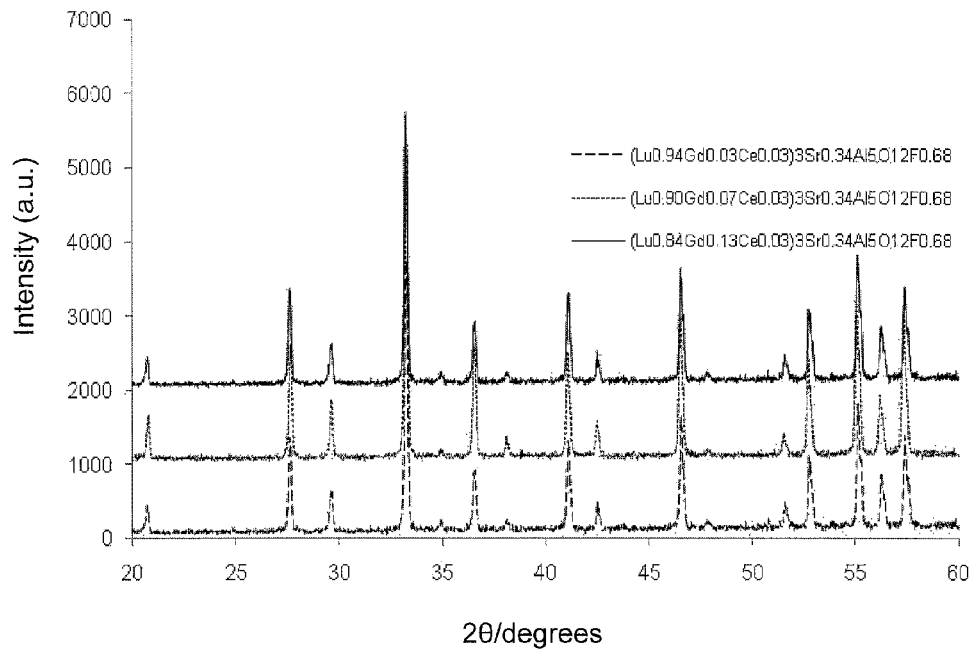
FIGS. 17A-B are the x-ray diffraction patterns of both the Ba series and the Sr series of phosphors whose luminosity data was depicted in FIGS. 16A-B.
Figure 17B:
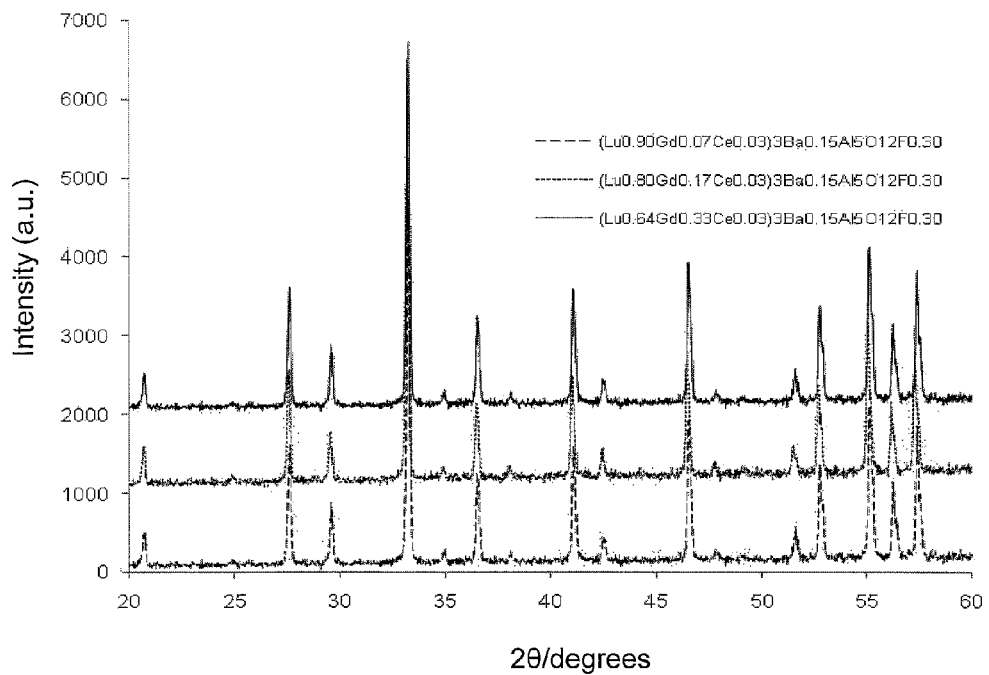

Shown in FIGS. 17A-B are the x-ray diffraction patterns of both the Ba series and the Sr series of phosphors whose luminosity data was depicted in FIGS. 16A-B.

Yellow-Emitting, Aluminate-Based Phosphors Featuring Terbium (Tb) and/or Gadolinium (Gd).

In certain compositions, according to the present embodiments, the yellow-green to yellow emitting halogenated aluminates featured the rare earth element terbium (Tb). The present inventors have conducted experiments comparing the relative effects of terbium and gadolinium in the composition $(Lu_{0.97-x}A_xCe_{0.03})_3Al_5O_{12}$, where A represents at least one of Gd and Tb, either individually, or in combinations. Terbium is adjacent to gadolinium in the periodic table: the former (Tb) has atomic number 65, and electronic structure $[Xe]4f^96s^2$, whereas the latter (Gd) has atomic number 64, and electronic structure $[Xe]4f^75d6s^2$. The formula $(Lu_{0.97-x}A_xCe_{0.03})_3Al_5O_{12}$ shows that both terbium and gadolinium substitute for the rare earth lutetium (Lu), atomic number 71, electronic structure $[Xe]4f^{14}5d6s^2$.

Further to the methods described above for fabricating the aluminate-based phosphors, the following methods may also be used. Methods of fabricating the novel aluminate-based phosphors disclosed herein are not limited to anyone fabrication method, but may, for example, be synthesized in a three step process that includes: 1) blending starting materials, 2) firing the starting material mix, and 3) various processes to be performed on the fired material, including pulverizing and drying. In some embodiments, the starting materials may comprise various kinds of powders, such as alkaline earth metal compounds, aluminum compounds and lutetium compounds. Examples of alkaline earth metal compounds include alkaline earth metal carbonates, nitrates, hydroxides, oxides, oxalates, halides, etc. Examples of aluminum-containing compounds include nitrates, fluorides and oxides. Examples of lutetium compounds include lutetium oxide, lutetium fluoride, and lutetium chloride. The starting materials are blended in a manner such that the desired final composition is achieved. In some embodiments, the alkaline-earth, aluminum-containing compounds and lutetium compounds are blended in the appropriate ratios, and then fired to achieve the desired composition. The blended starting materials may be fired in a second step, and a flux may be used to enhance the reactivity of the blended materials (at any or various stages of the firing). The flux may comprise various kinds of halides and boron compounds, examples of which include strontium fluoride, barium fluoride, strontium chloride, barium chloride and combinations thereof. Examples of boron-containing flux compounds include boric acid, boric oxide, strontium borate, barium borate and calcium borate.

In some embodiments, the flux compound is used in amounts where the number of mole percent ranges from between about 0.01 to 0.2 mole percent, where values may typically range from about 0.01 to 0.1 mole percent, both inclusive.

Various techniques for mixing the starting materials (with or without the flux) include, but are not limited to, using a mortar, mixing with a ball mill, mixing using a V-shaped mixer, mixing using a cross rotary mixer, mixing using a jet mill and mixing using an agitator. The starting materials may be either dry mixed or wet mixed, where dry mixing refers to mixing without using a solvent. Solvents that may be used in a wet mixing process include water or an organic solvent, where the organic solvent may be either methanol or ethanol. The mix of starting materials may be fired by numerous techniques known in the art. A heater such as an electric furnace or gas furnace may be used for the firing. The heater is not limited to any particular type, as long as the starting material mix is fired at the desired temperature for the desired length of time. In some embodiments, firing temperatures may range from about 800 to 1600° C. In other embodiments, the firing time may range from about 10 minutes to 1000 hours. The firing atmosphere may be selected from among air, a low pressure atmosphere, a vacuum, an inert-gas atmosphere, a nitrogen atmosphere, an oxygen atmosphere and an oxidizing atmosphere. In some embodiments, the compositions may be fired in a reducing atmosphere at between about 100° C. to about 1600° C. for between about 2 and about 10 hours. The phosphors disclosed herein may be prepared using a sol-gel method or a solid reaction method. In some embodiments, metal nitrates are used to provide the divalent metal component of the phosphor, as well as the aluminum component of the aluminate-based phosphor. In some embodiments, the metal nitrate that supplies the divalent metal component may be $Ba(NO_3)_2$, $Mg(NO_3)_2$ or $Sr(NO_3)_2$ and the metal nitrate that provides the aluminum may be $Al(NO_3)_3$.

This method may further include the step of using a metal oxide to provide the oxygen component of the aluminate-based phosphor. An example of the method includes the following steps: a) providing raw materials selected from the group consisting of $Ba(NO_3)_2$, $Mg(NO_3)_2$, $Ca(NO_3)_2$, $Sr(NO_3)_2$, $Al(NO_3)_3$, and $Lu_2O_3$; b) dissolving the $Lu_2O_3$ in a nitric acid solution and then mixing a desired amount of the metal nitrates to form an aqueous-based nitrate solution; c) heating the solution of step b) to form a gel; d) heating the gel of step c) to between about 500° C. and about 1000° C. to decompose the nitrate mixture to an oxide mixture; and e) sintering the powder of step d) in a reducing atmosphere at a temperature of between about 1000° C. and about 1500° C.,

TABLE 4

Yellow-emitting, aluminate-based phosphors featuring terbium (Tb) and/or gadolinium (Gd)

| Sample No. | Gd | Tb | Ce | CIE X | CIE Y | Emission Wavelength (nm) | PL (%) |
|---|---|---|---|---|---|---|---|
| T1 | 4 | 0.3 | 0.09 | 0.415 | 0.549 | 550.1 | 135.6 |
| T2 | 0 | 0.5 | 0.09 | 0.433 | 0.539 | 555.8 | 132.5 |
| TG1 | 0.2 | 0.3 | 0.09 | 0.442 | 0.534 | 558.4 | 128.3 |
| G1 | 0.2 | 0 | 0.09 | 0.413 | 0.550 | 550 | 131 |
| G2 | 0.3 | 0 | 0.09 | 0.436 | 0.537 | 556 | 125 |
| G3 | 0.5 | 0 | 0.09 | 0.448 | 0.530 | 560 | 121 |
| YAG1 | 0 | 0 | 0.09 | 0.427 | 0.548 | 550 | 140 |
| YAG2 | 0 | 0 | 0.09 | 0.442 | 0.537 | 557 | 135 |

TABLE 5

Gd Concentration

| Gd concentration | CIEx | CIEy | Emi/nm | Rel. PL | D50/μm |
|---|---|---|---|---|---|
| 0 | 0.375 | 0.564 | 541.2 | 140 | 12.8 |
| 0.1 | 0.394 | 0.556 | 545.4 | 135 | 13.2 |
| 0.2 | 0.418 | 0.547 | 551.0 | 130 | 13.0 |
| 0.3 | 0.434 | 0.538 | 556.1 | 127 | 13.0 |
| 0.4 | 0.445 | 0.532 | 559.2 | 125 | 13.5 |
| 0.5 | 0.452 | 0.528 | 562.8 | 121 | 13.3 |

TABLE 6

Tb Concentrations

| Tb concentration | CIEx | CIEy | Emi/nm | Rel. PL | D50/μm |
|---|---|---|---|---|---|
| 0 | 0.375 | 0.564 | 541.2 | 140 | 12.8 |
| 0.1 | 0.384 | 0.563 | 542.4 | 138 | 14.0 |
| 0.3 | 0.415 | 0.549 | 550.1 | 136 | 13.4 |
| 0.4 | 0.424 | 0.545 | 552.3 | 134 | 13.6 |
| 0.5 | 0.430 | 0.541 | 554.8 | 132 | 13.8 |
| 0.6 | 0.436 | 0.539 | 556.4 | 131 | 13.5 |
| 0.75 | 0.444 | 0.533 | 558.3 | 130 | 13.4 |
| 0.9 | 0.449 | 0.530 | 560.1 | 129 | 13.0 |
| 1.0 | 0.453 | 0.528 | 562.0 | 125 | 13.0 |

Referring to Table 4, those skilled in the art will recognize that all the compositions tabulated emitted light at a peak emission wavelength ranging from about 550 nm to about 560 nm. The first two entries, labeled T1 and T2, each contain no Gd, and have Tb concentrations of x=0.3 and 0.5, respectively. Thus their compositions are $(Lu_{0.67}Tb_{0.3}Ce_{0.03})_3Al_5O_{12}$ and $(Lu_{0.47}Tb_{0.5}Ce_{0.03})_3Al_5O_{12}$, respectively. They emit with the highest relative photoluminescent intensities of the compounds in Table 4, excepting YAG1 and YAG2.

The third composition from the top in Table 4 contains both Gd and Tb in concentrations of 0.2 and 0.3, respectively, and thus its stoichiometry is $(Lu_{0.67}Gd_{0.2}Tb_{0.3}Ce_{0.03})_3Al_5O_{12}$. This compound, with the designation TG1, emitted with a peak emission wavelength that was almost as high as $(Lu_{0.47}Tb_{0.5}Ce_{0.03})_3Al_5O_{12}$ (555.4 nm versus 555.8 nm, respectively), although its photoluminescent intensity was not as high as either of the two compounds containing Tb only and no Gd. The latter two compounds, $(Lu_{0.67}Tb_{0.3}Ce_{0.03})_3Al_5O_{12}$ and $(Lu_{0.47}Tb_{0.5}Ce_{0.03})_3Al_5O_{12}$, displayed a chromaticity coordinate CIE x and that was less than $(Lu_{0.47}Gd_{0.2}Tb_{0.3}Ce_{0.03})_3Al_5O_{12}$, and a CIE y chromaticity coordinate that was greater.

In the fourth populated row of Table 4, data is shown for the compound $(Lu_{0.77}Tb_{0.2}Ce_{0.03})_3Al_5O_{12}$, designated G1. This compound emits light with a peak wavelength at about 550 nm, the shortest wavelength of the group of compounds listed in Table 4, excepting YAG1. It also displays a chromaticity coordinate, CIE x, that is the lowest of the group. The CIE y coordinate of this compound was the highest of the group. A similar compound containing Gd, with no Tb, but with higher levels of Gd, designated G3, emitted light at the highest peak wavelength of the group. This compound had the formula $(Lu_{0.47}Tb_{0.5}Ce_{0.03})_3Al_5O_{12}$. Comparing $(Lu_{0.47}Tb_{0.5}Ce_{0.03})_3Al_5O_{12}$ with the $(Lu_{0.47}Tb_{0.5}Ce_{0.03})_3Al_5O_{12}$ compound discussed earlier shows that the Gd-containing compound emits at a longer wavelength than does the Tb-containing compound, but the Tb-containing compound emits with a higher photoluminescent intensity.

The two compositions in Table 4 labeled "YAG1" and "YAG2" are based on yttrium (Y) rather than lutetium (Lu)—these Y-based compositions are included for comparison. They each have the approximate formula $(Y_{0.97}Ce_{0.03})_3Al_5O_{12}$. These compounds also emit within the range 550 nm to 560 nm.

Figure 18:
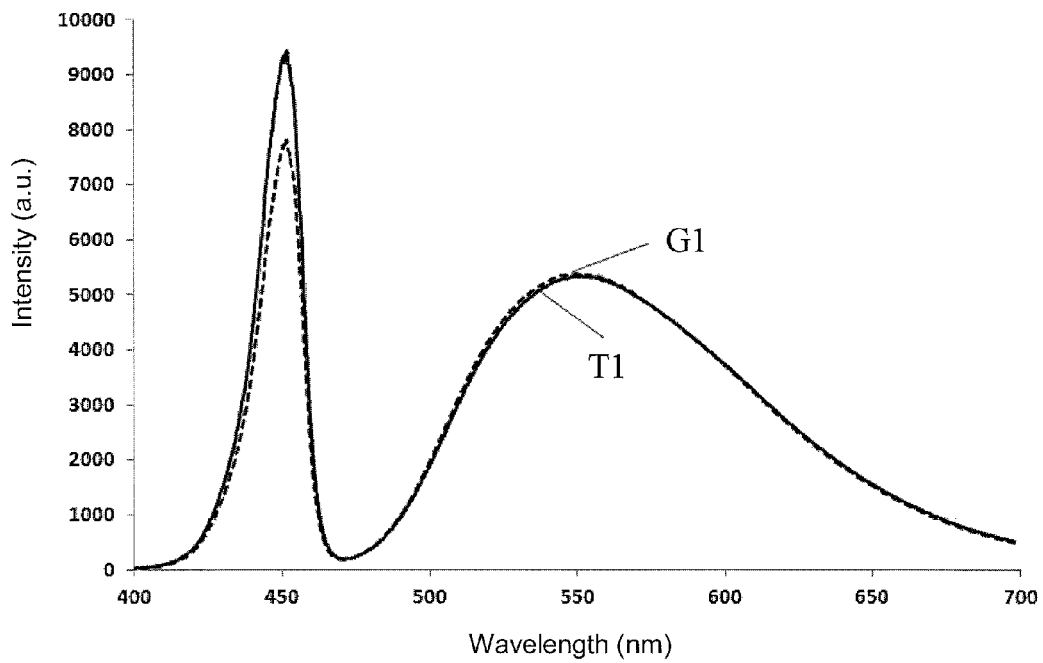
FIGS. 18-20 are photoemission spectra of representative Tb and/or Gd-containing phosphors excited by a blue light source, according to the present embodiments; the spectra plot photoluminescent intensity as a function of photoemission wavelength.
Figure 19:
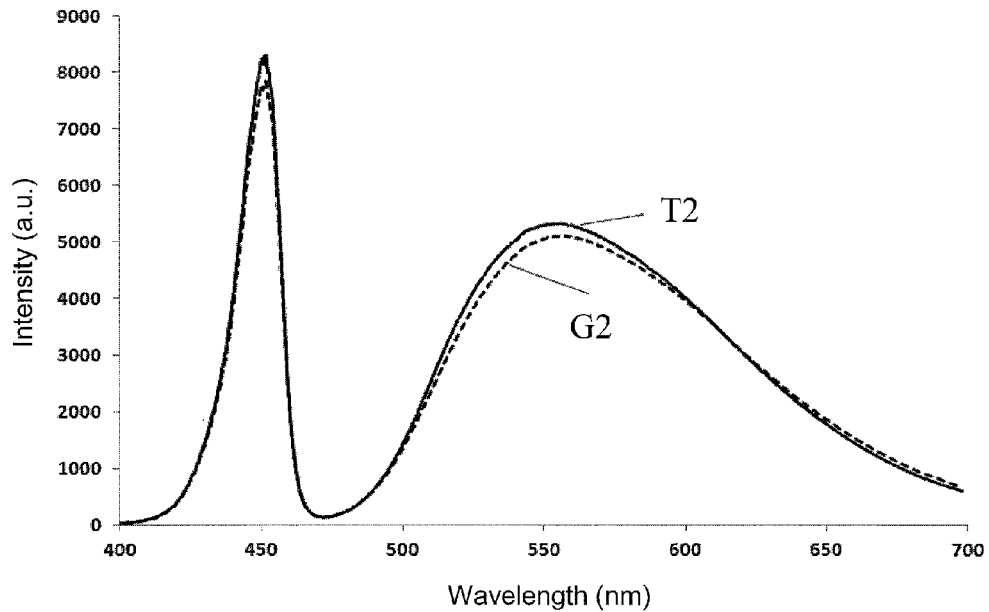
Figure 20:
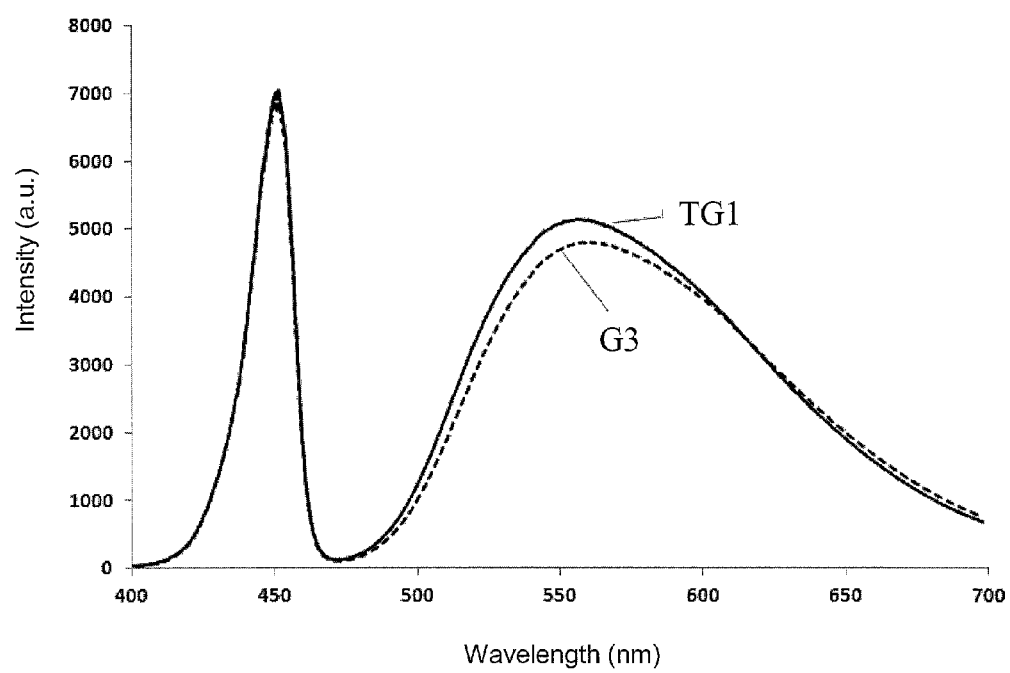

The data from Table 4 may be shown graphically, as shown in FIGS. 18-20, which figures also show a blue light source (such as a GaN LED) used for exciting the phosphor compositions of the present invention—the blue light source and yellow phosphor providing a "white" light source. FIG. 18 is a plot of the photoluminescent intensity of two compounds labeled "G1" and "T1." The former has a composition where the concentration of Gd is x=0.2, such that the formula is $(Lu_{0.77}Gd_{0.2}Ce_{0.03})_3Al_5O_{12}$. The peak emission wavelength is at about 550 nm. Here, the Gd containing compound (x=0.2, upper curve) has virtually identical photoluminescent intensity and peak emission wavelength as the sample labeled "T1" (lower curve).

The two compounds in FIG. 19 have about the same photoluminescent intensity as the compounds in FIG. 18, but the peak emission wavelengths in FIG. 19 are shifted slightly to longer wavelengths. The upper graph in FIG. 19 is "T2," and it has a Tb concentration of x=0.5, such that its composition is $(Lu_{0.47}Tb_{0.5}Ce_{0.03})_3Al_5O_{12}$. The lower curve in FIG. 19 is the sample "G2," and it has a Gd concentration of x=0.3, such that its composition is $(Lu_{0.67}Tb_{0.3}Ce_{0.03})_3Al_5O_{12}$. When these two compounds are compared, one sees that the Tb containing compound (x=0.5) has a slightly higher photoluminescent intensity than the "G2" compound, and a very slightly shorter peak emission wavelength.

Compounds with slightly longer wavelengths of emission, relative to FIGS. 19 and 18, are shown in FIG. 20. Referring to FIG. 20, the upper curve in the graph corresponds to the sample labeled "TG1," where the Gd concentration is 0.2 and the Tb concentration is 0.3, such that the phosphor has the formula $(Lu_{0.47}Gd_{0.2}Tb_{0.3}Ce_{0.03})_3Al_5O_{12}$. The lower curve in the graph corresponds to the sample labeled "G3," where the Gd concentration is 0.5. This compound has no Tb, so the formula is $(Lu_{0.47}Tb_{0.5}Ce_{0.03})_3Al_5O_{12}$. Here, the compound containing both Gd and Tb displays a higher photoluminescent intensity than the compound containing the same amount of rare earth (x=0.5) but in the form of Gd-only; the Tb and Gd containing compound emits at a slight shorter wavelength than the Gd-only compound.

Figure 21:
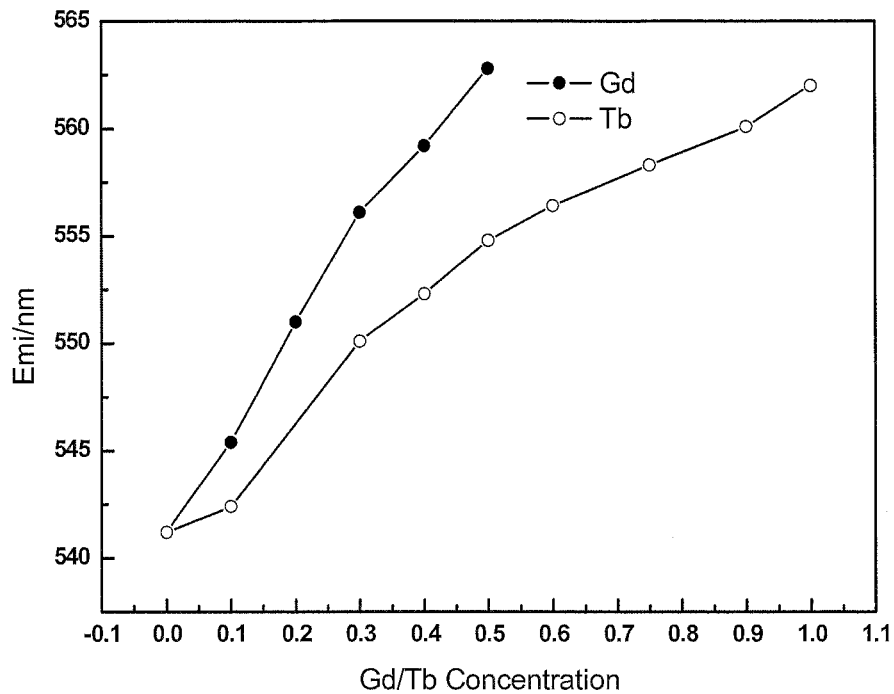
FIG. 21 is a plot of peak emission wavelength versus either Gd or Tb concentrations, and thus shows the effect of the amount of Gd and/or Tb inclusion on peak photoemission wavelength.

The effect of changing either the Gd concentration or the Tb concentration in a compound having the general formula $(Lu_{0.97}A_xCe_{0.03})_3Al_5O_{12}$, is shown in FIG. 21. (In this experiment, A is either Gd or Tb, but it is emphasized that according to embodiments of the present invention, Gd and Tb may be present either individually or in combinations.) Referring to FIG. 21, one skilled in the art may observe that increasing the Gd concentration from x=0 to x=0.5 causes the peak emission wavelength to increase more rapidly than did the peak emission wavelength for compounds in a series where the Tb concentration was increased from about x=0 to about x=1.0. Stated another way, to render the emission wavelength to increase from about 542 nm (where the phosphor contains only Lu at x=0) to about 562 nm, it was necessary to completely replace all of the Lu with Tb (x=1 for Tb), whereas this wavelength increase was achieved at a concentration of Gd at half that value (x=0.5, so that only half of the Lu has been replaced in the Gd series).

Figure 22:
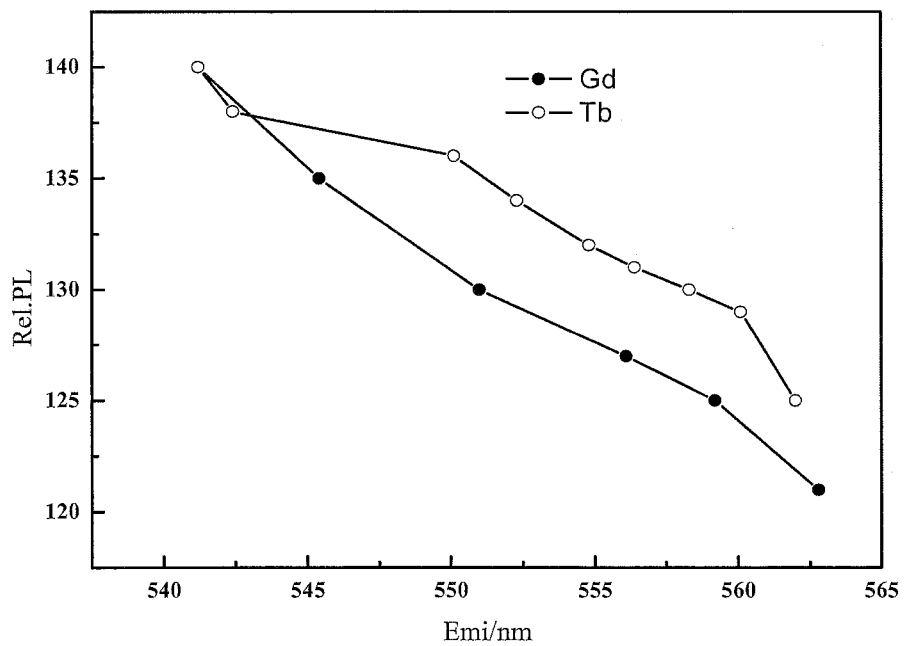
FIG. 22 is a plot of photoluminescent intensity versus peak emission wavelength for the same series of phosphors with varying Gd concentration and Tb concentration studied in FIG. 21.

The relationship between photoluminescent intensity and peak emission wavelength that the Gd-containing series of compounds have, versus the Tb-containing series of compounds, is shown in FIG. 22. In this graph, relative photoluminescent intensity on the ordinate (y-axis) is plotted against peak emission wavelength (in nm, on the x-axis). For both series of compounds, the relative photoluminescent intensity decreases as the Gd or Tb concentration increases (and, concomitantly, as the peak emission wavelength increases), with photoluminescent intensity decreasing faster in the Gd-containing series of samples than in the Tb-containing samples.

The specific data used to compose the plots in FIGS. 21 and 22 is provided in Tables 5 and 6 above.

Figure 23:
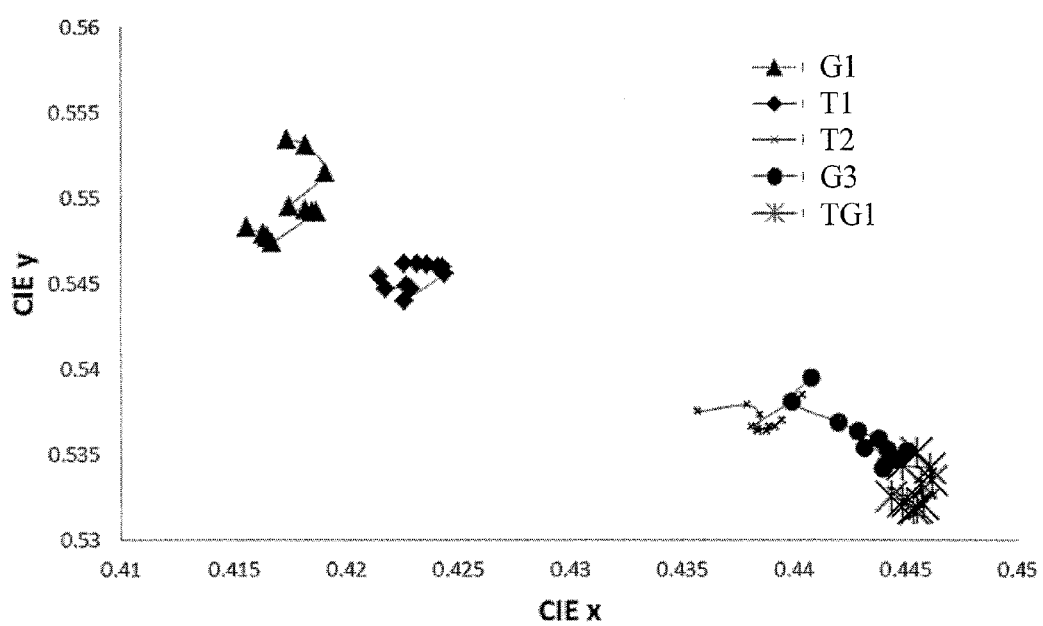
FIG. 23 is a graph of the CIE y-coordinate plotted against CIE x-coordinate for a series of exemplary phosphors being subjected to an increase in temperature; the data shows that increasing temperature leads to a decrease in the value of the CIE y-coordinate CIE y-coordinate, and an increase in the CIE x-coordinate.

The thermal stability of exemplary Tb-containing, and Tb and Gd-containing compounds is shown in FIG. 23. Also shown for comparison are Gd-containing phosphor compounds containing Gd but no Tb. Referring to FIG. 23, the CIE y chromaticity coordinate is plotted on the y-axis against the CIE x chromaticity coordinate on the x-axis. The data points are collected at 20 degree temperature intervals from 20° C. to 220° C. a temperature range that includes the operating temperatures of the phosphor materials for most applications. The data is shown in Tables 7(i) & 7(ii), A shift in CIE coordinates of less than 0.005 is preferred over the temperature range tested it is notable that only the Tb-containing materials show a shift of CIE coordinates within this range for both x and y coordinates. Specifically, only T1, T2 and TG1 exhibit the preferred temperature stability. The better temperature stability of the terbium-containing phosphor materials compared with the phosphor materials with gadolinium and no terbium is an unexpected result.

TABLE 7(i)

Temperature dependence of CIE for Tb and Gd containing compounds

| | G1 | | G3 | | T1 | |
|---|---|---|---|---|---|---|
| Temperature (° C.) | CIE X | CIE Y | CIE x | CIE y | CIE x | CIE y |
| 20 | 0.4156 | 0.5483 | 0.4441 | 0.5344 | 0.4215 | 0.5454 |
| 40 | 0.4163 | 0.5479 | 0.444 | 0.5342 | 0.4218 | 0.5447 |
| 60 | 0.4165 | 0.5477 | 0.4446 | 0.5347 | 0.4227 | 0.5449 |
| 80 | 0.4167 | 0.5474 | 0.4451 | 0.5352 | 0.4229 | 0.5447 |
| 100 | 0.4187 | 0.5492 | 0.4442 | 0.5353 | 0.4226 | 0.544 |
| 120 | 0.4185 | 0.5492 | 0.4432 | 0.5354 | 0.4244 | 0.5456 |
| 140 | 0.4182 | 0.5493 | 0.4438 | 0.5359 | 0.4243 | 0.546 |
| 160 | 0.4175 | 0.5495 | 0.4429 | 0.5364 | 0.4241 | 0.546 |
| 180 | 0.4191 | 0.5515 | 0.442 | 0.5369 | 0.42365 | 0.5461 |
| 200 | 0.4182 | 0.5531 | 0.4399 | 0.5381 | 0.4232 | 0.5462 |
| 220 | 0.4174 | 0.5534 | 0.4408 | 0.5395 | 0.4226 | 0.5462 |
| MAX Change | ΔCIE X = 0.0035 | ΔCIE Y = 0.0060 | ΔCIE X = 0.0043 | ΔCIE Y = 0.0053 | ΔCIE X = 0.0021 | ΔCIE Y = 0.0022 |

TABLE 7(ii)

Temperature dependence of CIE for Tb and Gd containing compounds

| Temperature (° C.) | T2 | | TG1 | |
| --- | --- | --- | --- | --- |
| | CIE x | CIE y | CIE x | CIE y |
| 20 | 0.4357 | 0.5375 | 0.4444 | 0.5325 |
| 40 | 0.4379 | 0.5379 | 0.4451 | 0.5322 |
| 60 | 0.4385 | 0.5373 | 0.4454 | 0.5318 |
| 80 | 0.4384 | 0.5364 | 0.4458 | 0.5321 |
| 100 | 0.4395 | 0.537 | 0.4455 | 0.5319 |
| 120 | 0.4388 | 0.5364 | 0.4449 | 0.5322 |
| 140 | 0.4392 | 0.5366 | 0.4457 | 0.5333 |
| 160 | 0.4389 | 0.5366 | 0.4462 | 0.5335 |
| 180 | 0.4384 | 0.5365 | 0.4461 | 0.5342 |
| 200 | 0.4381 | 0.5366 | 0.4449 | 0.5344 |
| 220 | 0.4404 | 0.5385 | 0.4455 | 0.5351 |
| MAX Change | $\Delta$CIE X = 0.0047 | $\Delta$CIE Y = 0.0020 | $\Delta$CIE X = 0.0018 | $\Delta$CIE Y = 0.0033 |

It is noted that the principles, embodiments, and concepts discussed in the present disclosure may be applied to this section that features terbium (Tb) and gadolinium (Gd). For example, in one embodiment of the present invention, the phosphor may comprise a cerium-activated, yellow-green to yellow-emitting aluminate-based phosphor having the formula $(Lu_{1-x-y}A_xCe_y)_3B_zAl_5O_{12}C_{2z}$; where A is at least one of Sc, La, Gd, and Tb; B is at least one of Mg, Sr, Ca, and Ba; C is at least one of F, Cl, Br, and I; $0.001 \leq x \leq 1.0$; $0.001 \leq y \leq 0.2$; and $0 \leq z \leq 0.5$, and the phosphor in this embodiment contains at least some Tb.

In another embodiment of the present invention, the phosphor comprises a cerium-activated, yellow-green to yellow-emitting aluminate-based phosphor having the formula $(Lu_{1-x}A_x)_3Al_5O_{12}$:Ce, where A is at least one rare earth selected from the group consisting of Gd and Tb, either individually or in combinations; x ranges from about 0.001 to about 1.0; and the phosphor contains at least some Tb.

In another embodiment of the present invention, the phosphor comprises a cerium-activated, yellow-green to yellow-emitting aluminate-based phosphor represented by the formula $(Lu_{0.97}A_xCe_{0.03})_3Al_5O_{12}$. Here, A is at least one rare earth selected from the group consisting of Gd and Tb; and x ranges from about 0.001 to about 1.0. As with the embodiment disclosed in the previous paragraph, this phosphor also contains at least some Tb.

Although the present invention has been particularly described with reference to yellow-green to yellow emitting aluminate-based phosphors, the teaching and principles of the present invention apply also to phosphors in which the Al has been replaced, in whole or in part, by Ga, Si or Ge—for example, silicate-, galliate- and germanate-based phosphors.

The embodiments of the phosphor materials containing halogens may have the halogen: (1) contained within the crystal substitutionally; (2) contained within the crystal interstitially; and/or (3) contained within grain boundaries that separate crystalline grains, regions and/or phases.

According to further embodiments of the present invention, the Lu aluminate materials in Table 8 have been made and tested, as described above. An example is provided of a representative procedure for making a compound with the formula $(Lu_{1-y}Ce_y)_3Al_5O_{12}$. $Lu_2O_3$ (272.664 g), $CeO_2$ (7.295 g), $Al_2O_3$ (120.041 g) and a flux (20.000 g) are mixed for between 4 and 20 hours with a mixer and then added to a crucible. The crucible is placed into a continuous furnace and sintered at between 1500° C. and 1700° C. for between 2 and 10 hours under reduced atmosphere. The sintered material is converted into a powder with a crushing machine. The powder is washed with acid and deionized water and then dried at between 120° C. and 180° C. for between 12 and 24 hours in an oven. Finally the powder is sieved through a 20 μm mesh to provide $Lu_{2.945}Ce_{0.055}Al_5O_{12}$ and characterized (i.e., emission wavelength, intensity, and CIE values, particle size distribution, etc.).

TABLE 8

Further examples of green and yellow lutetium aluminate phosphors

| # | Composition | CIEx | CIEy | Emission Peak (nm) | Relative PL Intensity | D50 (μm) |
| --- | --- | --- | --- | --- | --- | --- |
| 1 | $Lu_{2.70}Gd_{0.21}Ce_{0.09}Ba_{0.15}Al_5O_{12}F_{0.3}$ | 0.424 | 0.543 | 554 | 114 | 12 |
| 2 | $Lu_{2.40}Gd_{0.51}Ce_{0.09}Ba_{0.15}Al_5O_{12}F_{0.3}$ | 0.453 | 0.525 | 565 | 111 | 11 |
| 3 | $Lu_{1.92}Gd_{0.99}Ce_{0.09}Ba_{0.15}Al_5O_{12}F_{0.3}$ | 0.480 | 0.505 | 576 | 101 | 10 |
| 4 | $Lu_{2.82}Gd_{0.09}Ce_{0.09}Sr_{0.34}Al_5O_{12}F_{0.68}$ | 0.413 | 0.555 | 551 | 132 | 16 |
| 5 | $Lu_{2.70}Gd_{0.21}Ce_{0.09}Sr_{0.34}Al_5O_{12}F_{0.68}$ | 0.429 | 0.545 | 555 | 138 | 13 |
| 6 | $Lu_{2.52}Gd_{0.39}Ce_{0.09}Sr_{0.34}Al_5O_{12}F_{0.68}$ | 0.436 | 0.537 | 558 | 122 | 14 |
| 7 | $Lu_{2.975}Ce_{0.025}Al_5O_{12}$ | 0.327 | 0.578 | 515 | 135 | 13 |
| 8 | $Lu_{2.97}Ce_{0.03}Al_5O_{12}$ | 0.334 | 0.577 | 520 | 135 | 13 |
| 9 | $Lu_{2.965}Ce_{0.035}Al_5O_{12}$ | 0.340 | 0.576 | 525 | 135 | 13 |
| 10 | $Lu_{2.96}Ce_{0.04}Al_5O_{12}$ | 0.347 | 0.573 | 530 | 135 | 13 |
| 11 | $Lu_{2.96}Ce_{0.04}Al_5O_{12}$ | 0.354 | 0.573 | 530 | 115 | 5.5 |
| 12 | $Lu_{2.945}Ce_{0.055}Al_5O_{12}$ | 0.354 | 0.569 | 534 | 137 | 13 |
| 13 | $Lu_{2.93}Ce_{0.07}Al_5O_{12}$ | 0.372 | 0.564 | 540 | 135 | 11 |
| 14 | $Lu_{2.84}Gd_{0.1}Ce_{0.06}Al_5O_{12}$ | 0.392 | 0.556 | 543 | 135 | 14 |
| 15 | $Lu_{2.84}Gd_{0.1}Ce_{0.06}Al_5O_{12}$ | 0.395 | 0.555 | 545 | 130 | 10 |
| 16 | $Lu_{2.84}Gd_{0.1}Ce_{0.06}Al_5O_{12}$ | 0.393 | 0.557 | 545 | 120 | 7 |
| 17 | $Lu_{2.64}Gd_{0.3}Ce_{0.06}Al_5O_{12}$ | 0.415 | 0.549 | 550 | 135 | 13 |
| 18 | Equal proportions of: $Lu_{2.64}Gd_{0.3}Ce_{0.06}Al_5O_{12}$ and $Lu_{2.44}Gd_{0.5}Ce_{0.06}Al_5O_{12}$ | 0.431 | 0.540 | 555 | 125 | 13 |
| 19 | $Lu_{2.44}Gd_{0.5}Ce_{0.06}Al_5O_{12}$ | 0.447 | 0.532 | 560 | 120 | 13 |

According to further aspects of the invention, a white light illumination system may comprise: an excitation source with emission wavelength within a range of 200 nm to 480 nm; at least one of a red-emitting phosphor or a green-emitting phosphor; and a cerium-activated, yellow-green to yellow-emitting lutetium aluminate-based phosphor comprising terbium, wherein the phosphor is configured to emit light having a peak emission wavelength ranging from about 550 nm to about 565 nm. (See above for examples of the specific compounds that meet this requirement and also for examples that further meet the requirement that follows.) Furthermore, the cerium-activated, yellow-green to yellow-emitting lutetium aluminate-based phosphor may be configured to absorb excitation radiation having a wavelength ranging from about 380 nm to about 480 nm. Yet furthermore, the red-emitting phosphor may have an emission wavelength within a range of 600 nm to 660 nm. Furthermore, the green-emitting phosphor may have an emission wavelength within a range of 500 nm to 545 nm. Yet furthermore, the red-emitting phosphor may be a nitride. Furthermore, the nitride may be at least one of $(Ca,Sr)AlSiN_3:Eu^{2+}$, $(Ca,Sr)_2N_5N_8:Eu^{2+}$, and $(Ca,Sr)AlSi_4N_7:Eu^{2+}$. Yet furthermore, the green-emitting phosphor may be a silicate. Furthermore, the silicate may have the formula $(Sr,Ba,Mg)_2SiO_4:Eu^{2+}$.

According to some embodiments, a cerium-activated, yellow-green to yellow-emitting lutetium aluminate-based phosphor may have the formula $(Lu_{1-x}Tb_x)_3Al_5O_{12}:Ce$, wherein x ranges from about 0.1 to less than 1.0 and wherein the phosphor is configured to absorb excitation radiation having a wavelength ranging from about 380 nm to about 480 nm, and to emit light having a peak emission wavelength ranging from about 550 nm to about 565 nm. Furthermore, x may range from about 0.3 to less than 1.0. Furthermore, the excitation radiation may have a wavelength ranging from about 420 nm to about 480 nm. Furthermore, the formula may be $(Lu_{0.97}Tb_xCe_{0.03})_3Al_5O_{12}$. Furthermore, x may be in the range of 0.3 to 0.5, endpoints inclusive. Furthermore, the cerium-activated, yellow-green to yellow-emitting lutetium aluminate-based phosphor may include the rare earth element gadolinium (Gd). Furthermore, the cerium-activated, yellow-green to yellow-emitting lutetium aluminate-based phosphor may include the rare earth element gadolinium (Gd) and the formula may be $(Lu_{1-x-y}Tb_xGd_y)_3Al_5O_{12}:Ce$, wherein x ranges from about 0.1 to less than 1.0, y is greater than zero, and x+y<1. Furthermore, the cerium-activated, yellow-green to yellow-emitting lutetium aluminate-based phosphor may include the rare earth element gadolinium (Gd) and the formula may be $(Lu_{0.97}Tb_xGd_yCe_{0.03})_3Al_5O_{12}$, wherein y is greater than zero and x+y<1, and in some embodiments x=0.3 and y=0.2. Furthermore, the cerium-activated, yellow-green to yellow-emitting lutetium aluminate-based phosphor may include a halogen. Furthermore, the cerium-activated, yellow-green to yellow-emitting lutetium aluminate-based phosphor may include a halogen contained within the crystal substitutionally. Furthermore, the cerium-activated, yellow-green to yellow-emitting lutetium aluminate-based phosphor may include a halogen contained within the crystal interstitially.

According to some embodiments, a cerium-activated, yellow-green to yellow-emitting lutetium aluminate-based phosphor may have the formula $(Lu_{1-x}Tb_x)_3A_zAl_5O_{12}C_{2z}:Ce$, wherein: A is at least one of Mg, Sr, Ca, and Ba; B is at least one of F, Cl, Br, and I; $0.001 \leq x < 1.0$; and $0 < z \leq 0.5$. Furthermore, the yellow-green to yellow-emitting aluminate-based phosphor may further include the rare earth element gadolinium (Gd).

According to some embodiments, a white light illumination system may comprise: an excitation source with emission wavelength within a range of 200 nm to 480 nm; at least one of a red-emitting phosphor or a green-emitting phosphor; and a cerium-activated, yellow-green to yellow-emitting lutetium aluminate-based phosphor comprising terbium, wherein the phosphor is configured to emit light having a peak emission wavelength ranging from about 550 nm to about 565 nm. Furthermore, the cerium-activated, yellow-green to yellow-emitting lutetium aluminate-based phosphor may be configured to absorb excitation radiation having a wavelength ranging from about 380 nm to about 480 nm. Furthermore, the red-emitting phosphor may have an emission wavelength within a range of 600 nm to 660 nm. Furthermore, the green-emitting phosphor may have an emission wavelength within a range of 500 nm to 545 nm. Furthermore, the red-emitting phosphor may be a nitride, and in some embodiments the nitride may be at least one of $(Ca,Sr)AlSiN_3:Eu^{2+}$, $(Ca,Sr)_2N_5N_8:Eu^{2-}$, and $(Ca,Sr)AlSi_4N_7:Eu^{2+}$. Furthermore, the green-emitting phosphor may be a silicate, and in some embodiments the silicate has the formula $(Sr,Ba,Mg)_2SiO_4:Eu^{2+}$.

Although the present invention has been particularly described with reference to certain embodiments thereof, it should be readily apparent to those of ordinary skill in the art that changes and modifications in the form and details may be made without departing from the spirit and scope of the invention.

What is claimed is:

1. A cerium-activated, yellow-green to yellow-emitting lutetium aluminate-based phosphor having the formula $(Lu_{1-x-y}A_xCe_y)_3B_zD_5O_{12}C_w$, and wherein:
   A is at least one of Sc, La, Gd and Tb;
   B is at least one of Mg, Sr, Ca, and Ba;
   C is at least one of F, Cl, Br, and I;
   D is at least one of Al, Ga, Si and Ge;
   $0.001 \leq x \leq 1.0$;
   $0.001 \leq y \leq 0.2$;
   $0.001 \leq z \leq 0.5$; and
   $2z > w \geq 2zp$, wherein p is chosen from the group consisting of 0.50, 0.75, 0.90 and 0.95.

2. The yellow-green to yellow-emitting lutetium aluminate-based phosphor of claim 1, wherein $2z > w \geq z$.

3. The yellow-green to yellow-emitting lutetium aluminate-based phosphor of claim 1, wherein $2z > w \geq 1.5z$.

4. The yellow-green to yellow-emitting lutetium aluminate-based phosphor of claim 1, wherein $2z > w \geq 1.8z$.

5. The yellow-green to yellow-emitting lutetium aluminate-based phosphor of claim 1, wherein $2z > w \geq 1.9z$.

6. The yellow-green to yellow-emitting lutetium aluminate-based phosphor of claim 1, wherein C is contained within the crystal substitutionally.

7. The yellow-green to yellow-emitting lutetium aluminate-based phosphor of claim 1, wherein C is contained within the crystal interstitially.

8. The yellow-green to yellow-emitting lutetium aluminate-based phosphor of claim 1, wherein:
   A is at least one of Gd and Tb; and
   D is Al.

9. The yellow-green to yellow-emitting lutetium aluminate-based phosphor of claim 1, wherein:
   A is Tb; and
   D is Al.

10. The yellow-green to yellow-emitting lutetium aluminate-based phosphor of claim 1, wherein:
    B is at least one of Sr and Ba; and
    C is F.

11. The yellow-green to yellow-emitting lutetium aluminate-based phosphor of claim 1, wherein the yellow-green to yellow-emitting lutetium aluminate-based phosphor is configured to absorb excitation radiation having a wavelength ranging from about 380 nm to about 480 nm, and to emit light having a peak emission wavelength ranging from about 550 nm to about 565 nm.

12. A cerium-activated, yellow-green to yellow-emitting lutetium aluminate-based phosphor consisting of: lutetium, terbium, cerium, aluminum, oxygen, barium and fluorine, wherein the stoichiometric ratio of fluorine to barium is less than 2.

13. A white light illumination system comprising:
   an excitation source with emission wavelength within a range of 200 nm to 480 nm;
   at least one of a red-emitting phosphor or a green-emitting phosphor; and
   a cerium-activated, yellow-green to yellow-emitting lutetium aluminate-based phosphor comprising terbium of claim 1, wherein the phosphor is configured to emit light having a peak emission wavelength ranging from about 550 nm to about 565 nm.

14. The white light illumination system of claim 13, wherein the cerium-activated, yellow-green to yellow-emitting lutetium aluminate-based phosphor is configured to absorb excitation radiation having a wavelength ranging from about 380 nm to about 480 nm.

15. The white light illumination system of claim 13, wherein the red-emitting phosphor has an emission wavelength within a range of 600 nm to 660 nm.

16. The white light illumination system of claim 13, wherein the green-emitting phosphor has an emission wavelength within a range of 500 nm to 545 nm.

17. The white light illumination system of claim 13, wherein the red-emitting phosphor is a nitride.

18. The white light illumination system of claim 17, wherein the nitride is at least one of $(Ca,Sr)AlSiN_3:Eu^{2+}$, $(Ca,Sr)_2N_5N_8:Eu^{2+}$, and $(Ca,Sr)AlSi_4N_7:Eu^{2+}$.

19. The white light illumination system of claim 13, wherein the green-emitting phosphor is a silicate.

20. The white light illumination system of claim 19, wherein the silicate has the formula $(Sr,Ba,Mg)_2SiO_4:Eu^{2+}$.

21. A white light illumination system comprising:
   an excitation source with emission wavelength within a range of 200 nm to 480 nm;
   at least one of a red-emitting phosphor or a green-emitting phosphor; and
   a cerium-activated, yellow-green to yellow-emitting lutetium aluminate-based phosphor of claim 12, wherein the phosphor is configured to emit light having a peak emission wavelength ranging from about 550 nm to about 565 nm.

22. The white light illumination system of claim 21, wherein the cerium-activated, yellow-green to yellow-emitting lutetium aluminate-based phosphor is configured to absorb excitation radiation having a wavelength ranging from about 380 nm to about 480 nm.

23. The white light illumination system of claim 21, wherein the red-emitting phosphor has an emission wavelength within a range of 600 nm to 660 nm.

24. The white light illumination system of claim 21, wherein the green-emitting phosphor has an emission wavelength within a range of 500 nm to 545 nm.

25. The white light illumination system of claim 21, wherein the red-emitting phosphor is a nitride.

* * * * *